United States Patent
Grant et al.

(10) Patent No.: US 6,579,728 B2
(45) Date of Patent: Jun. 17, 2003

(54) FABRICATION OF A HIGH RESOLUTION, LOW PROFILE CREDIT CARD READER AND CARD READER FOR TRANSMISSION OF DATA BY SOUND

(75) Inventors: Alan H. Grant, Chevy Chase, MD (US); Richard J. Gambino, Stony Brook, NY (US)

(73) Assignee: Privicom, Inc., Chevy Chase, MD (US)

(*) Notice: Subject to any disclaimer, the term of this patent is extended or adjusted under 35 U.S.C. 154(b) by 0 days.

(21) Appl. No.: 09/902,623

(22) Filed: Jul. 12, 2001

(65) Prior Publication Data

US 2002/0017568 A1 Feb. 14, 2002

Related U.S. Application Data

(63) Continuation-in-part of application No. 09/592,607, filed on Jun. 12, 2000, which is a continuation-in-part of application No. 09/127,812, filed on Aug. 3, 1998, now Pat. No. 6,129,277.

(51) Int. Cl.[7] ............................................. H01L 21/00
(52) U.S. Cl. ........................... 438/3; 438/48; 438/460; 438/462
(58) Field of Search ........................... 438/3, 68, 460, 438/462

(56) References Cited

U.S. PATENT DOCUMENTS

| | | | |
|---|---|---|---|
| 3,972,035 A | * | 7/1976 | Holtzberg et al. ............. 365/7 |
| 4,021,767 A | * | 5/1977 | Nonaka et al. ............ 338/32 H |
| 4,197,987 A | | 4/1980 | Lazzari |
| 4,213,039 A | | 7/1980 | Schasser |
| 4,750,201 A | | 6/1988 | Hodgson et al. |
| 4,868,849 A | | 9/1989 | Tamaoki |
| 4,897,865 A | | 1/1990 | Canuel |
| 5,144,654 A | | 9/1992 | Kelley et al. |
| 5,182,767 A | | 1/1993 | Bernard |
| 5,198,069 A | * | 3/1993 | Zimmermann et al. ....... 438/68 |
| 5,229,894 A | | 7/1993 | Collins et al. |
| 5,314,844 A | * | 5/1994 | Imamura ....................... 225/2 |
| 5,331,181 A | | 7/1994 | Biggs |
| 5,343,519 A | | 8/1994 | Feldman |
| 5,358,088 A | | 10/1994 | Barnes et al. |
| 5,359,182 A | | 10/1994 | Schilling |

(List continued on next page.)

OTHER PUBLICATIONS

"Hall Probe Sensor Array For Magnetic Card Read–OUT" IBM Technical Disclosure Bulletin, IBM Corp. New York, U.S. vol. 37, No. 7, Jul. 1, 1994, pp. 443–444.

Volpe, F P/Volpe S: "Magnetkarten–Grundlagen, Technik, Anwendungen" 1995, Heise Verlag, Hannover, pp. 57 and 66.

*Primary Examiner*—John F. Niebling
*Assistant Examiner*—Angel Roman
(74) *Attorney, Agent, or Firm*—Jacobson Holman PLLC

(57) ABSTRACT

A portable card reader designed to be carried in a wallet or purse has an electromagnetic head that reads information from a magnetic strip of a card or information is read from the card by an array of Hall sensors. In a further embodiment, the card reader uses a magnetic sensor based on magnetoresistive sensing of magnetic transitions of a magnetic stripe, suitable for use with small, portable electronic devices. In each embodiment, the information read from the card may be converted to a sequence of electronic bursts of predetermined frequency, preferably in the audible or ultrasound range. The sound signals are output by a speaker to the microphone of a telephone. The signal is then transmitted over the telephone lines to a remote receiver. The receiver then converts the sound bursts into signal pulses, which can be read using the computer software of a conventional card reader.

34 Claims, 22 Drawing Sheets

U.S. PATENT DOCUMENTS

| | | |
|---|---|---|
| 5,377,263 A | 12/1994 | Bazemore et al. |
| 5,396,455 A | 3/1995 | Brady et al. |
| 5,455,857 A | 10/1995 | McGuire |
| 5,465,291 A | 11/1995 | Barrus et al. |
| 5,524,072 A | 6/1996 | Labaton et al. |
| 5,539,819 A | 7/1996 | Sonoyama et al. |
| 5,543,988 A | 8/1996 | Brady et al. |
| 5,559,051 A * | 9/1996 | Voldman et al. ............... 438/3 |
| 5,561,710 A | 10/1996 | Helms |
| 5,583,933 A | 12/1996 | Mark |
| 5,636,271 A | 6/1997 | Paterno et al. |
| 5,701,339 A | 12/1997 | Suda |
| 5,740,232 A | 4/1998 | Pailles et al. |
| 5,764,742 A | 6/1998 | Howard et al. |
| 5,814,532 A * | 9/1998 | Ichihara ........................ 438/33 |
| 6,129,277 A * | 10/2000 | Grant et al. ................. 235/449 |
| 6,204,071 B1 * | 3/2001 | Ju et al. ......................... 438/3 |
| 6,291,087 B1 * | 9/2001 | Xiao et al. .................. 428/692 |
| 2002/0064891 A1 * | 5/2002 | Gambino et al. .............. 438/3 |

* cited by examiner

FABRICATION OF A HIGH RESOLUTION, LOW PROFILE CREDIT CARD READER AND CARD READER FOR TRANSMISSION OF DATA BY SOUND

This is a Continuation-In-Part (CIP) application of Ser. No. 09/592,607 filed Jun. 12, 2000, which is a CIP application of Ser. No. 09/127,812 filed Aug. 3, 1998, now U.S. Pat. No. 6,129,277 issued Oct. 10, 2000.

BACKGROUND OF THE INVENTION

1. Field of the Invention

The present invention relates to an apparatus for reading information stored on a magnetic strip card and transmitting the data to a remote location. More particularly, the present invention relates to the fabrication of a high resolution, low profile credit card reader, especially for use with a credit card, phone card, or the like.

2. Description of the Related Art

Plastic cards having electronically stored data are widely used to perform a large variety of tasks, from being used as conventional credit, telephone, or bank cards to use as a security key to operate a door lock. Other types of cards are gasoline credit cards, building, room and/or elevator security access cards, personnel cards, Automated Teller Machine (ATM) cards, debit cards and cash cards. For purposes of this application, however, these cards will be generically referenced as "authorization cards" or just "cards."

Authorization cards fall into three general categories: magnetic, electronic or "smart cards," and passive electronic cards. Confidential information, such as a unique account or card number, is typically stored on the card. In addition, the card number is printed on the face of the card, usually together with other security information such as the owner's name, the card's expiration date, and/or a Personal Identification Number (PIN).

In order to complete a given transaction at the point of sale, the card number and/or other confidential information is transmitted from the card to a card reader for recognition and authorization by running the card through the card reader.

Problems arise with the use of conventional inductive read head credit card readers, particularly when they are attached or connected to such devices as personnel computers, laptops, hand held computing devices and cell phones. The prior art inductive read head is not well suited to such small portable electronic devices. The strength of the signal from an inductive head depends on the rate of travel of the magnetic stripe past the gap in the magnetic core of the head. The faster the travel, the larger the voltage induced in the pickup coil of the head. The card must be guided during its motion so that the magnetic stripe is moving in close proximity to (usually in contact with) the pole tips of the head core. The required motion and control is usually obtained by holding or affixing the card reader firmly to a surface and swiping the card through the guide slot. The guide slot is generally longer than the credit card (80 mm) and about 10 mm deep. The size and shape of the device make it difficult to integrate with small portable electronic devices. Also the motion required is sometimes incompatible with the operation of the device. For example, it would be difficult to swipe a credit card through an inductive card reader attached to the side of a cell phone while carrying out voice communication with the merchant.

Fabrication of credit card readers, which typically relies upon photolithography, is also a rather exacting process involving a series of steps. A simpler method of fabrication that does not require lithography would be desirable.

SUMMARY OF THE INVENTION

It is therefore a primary object of the present invention to provide a method for fabricating a low profile credit card reader suitable for use with small devices.

It is a further object of the invention to provide a method for fabricating a high resolution magnetoresistive sensor for reading magnetically stored digital information on a credit card without lithography.

It is a further object of the invention to provide a card reader having an output that is independent of the speed of motion of the card with respect to the sensor.

It is a further object to provide a card reader that is less subject to mechanical wear.

It is yet another object of the invention to provide a card reader capable of large voltage signals.

It is another object of the invention to provide a card reader that can operate in conjunction with existing magnetic cards.

It is still another object of the invention to provide a thin profile card reader suitable for small portable electronic devices through the use of magnetoresistive sensing elements.

It is another object of the invention to provide means for reading data stored on an authorization card and sending the data over a telephone to a remote card reader receiver.

It is a further object of the invention to provide a card that generates a sound that is converted to an electronic signal that can be transmitted over a telephone line, and to provide a card reader that is portable and lightweight and can be carried in a pocket, wallet or purse.

In accordance with the above objects, the present invention is a portable card reader that is designed to be carried in a wallet or purse. In a first embodiment, the card reader has an electromagnetic head that reads information from a magnetic strip of a card. In a second embodiment, information is read from the card by an array of Hall sensors. In a further embodiment, the card reader uses a magnetic sensor based on magnetoresistive sensing of magnetic transitions of a magnetic stripe. In each embodiment, the information read from the card may be converted to a sequence of sound bursts of predetermined frequency, preferably in the audible or ultrasound range. The sound signals are output by a speaker to the microphone of a telephone. The signal is then transmitted over the telephone lines to a remote receiver which converts the sound bursts into signal pulses which can be read using the computer software of a conventional card reader.

The present invention is also directed to a method for fabricating a credit card reader that offers both high resolution and low profile. The card reader uses a magnetic sensor based on magnetoresistive sensing of the magnetic transitions of a magnetic stripe.

DETAILED DESCRIPTION OF THE PREFERRED EMBODIMENTS

Figure 1:
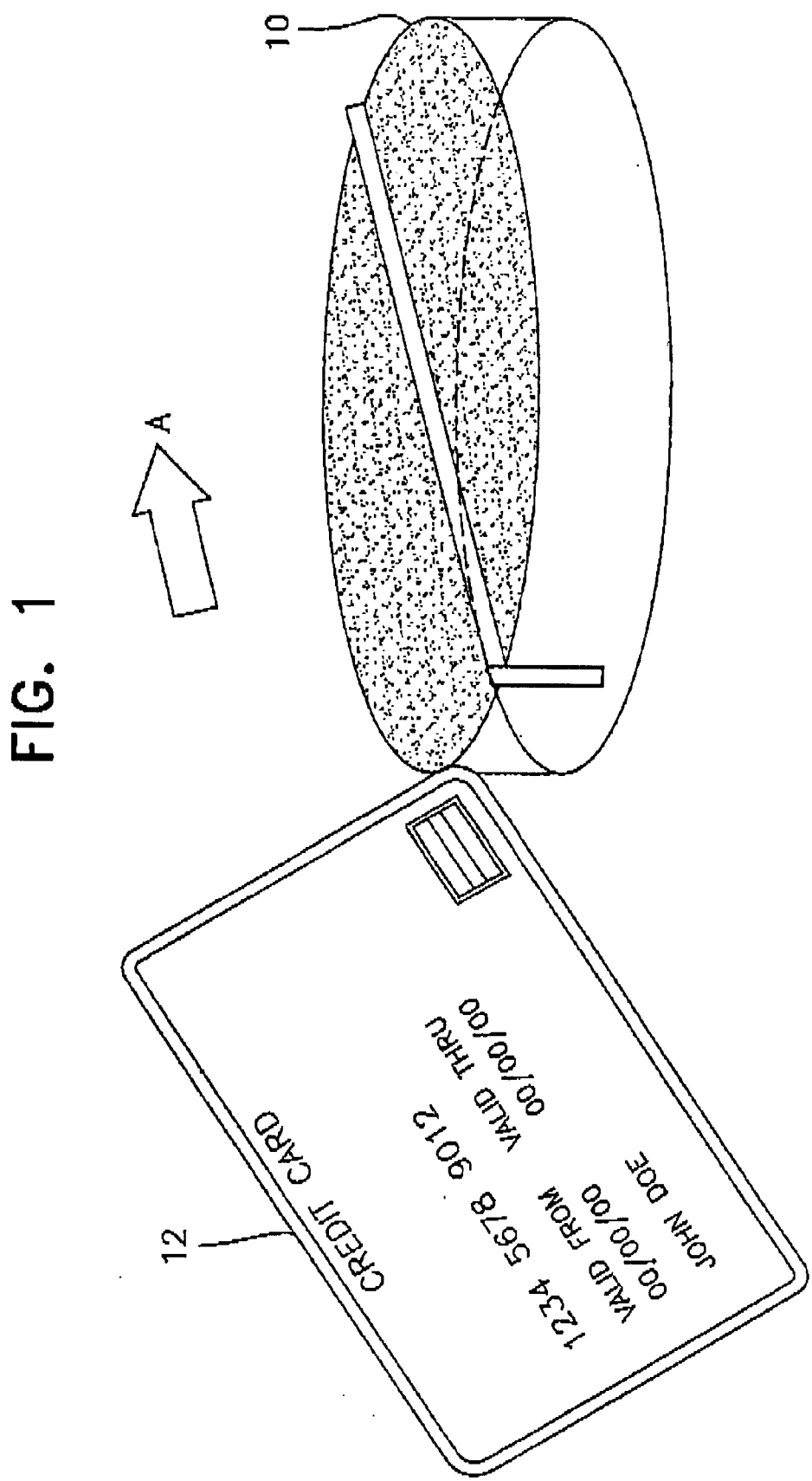
FIG. 1 is a perspective drawing of the card reader in accordance with the first embodiment of the invention.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar purpose.

Turning to the drawings, FIG. 1 shows a magnetic card reader 10 used with a conventional credit card 12 having a magnetic strip. The credit card 12 is passed or "swiped" through the reader 10 in the direction of the arrow A.

Figure 2:
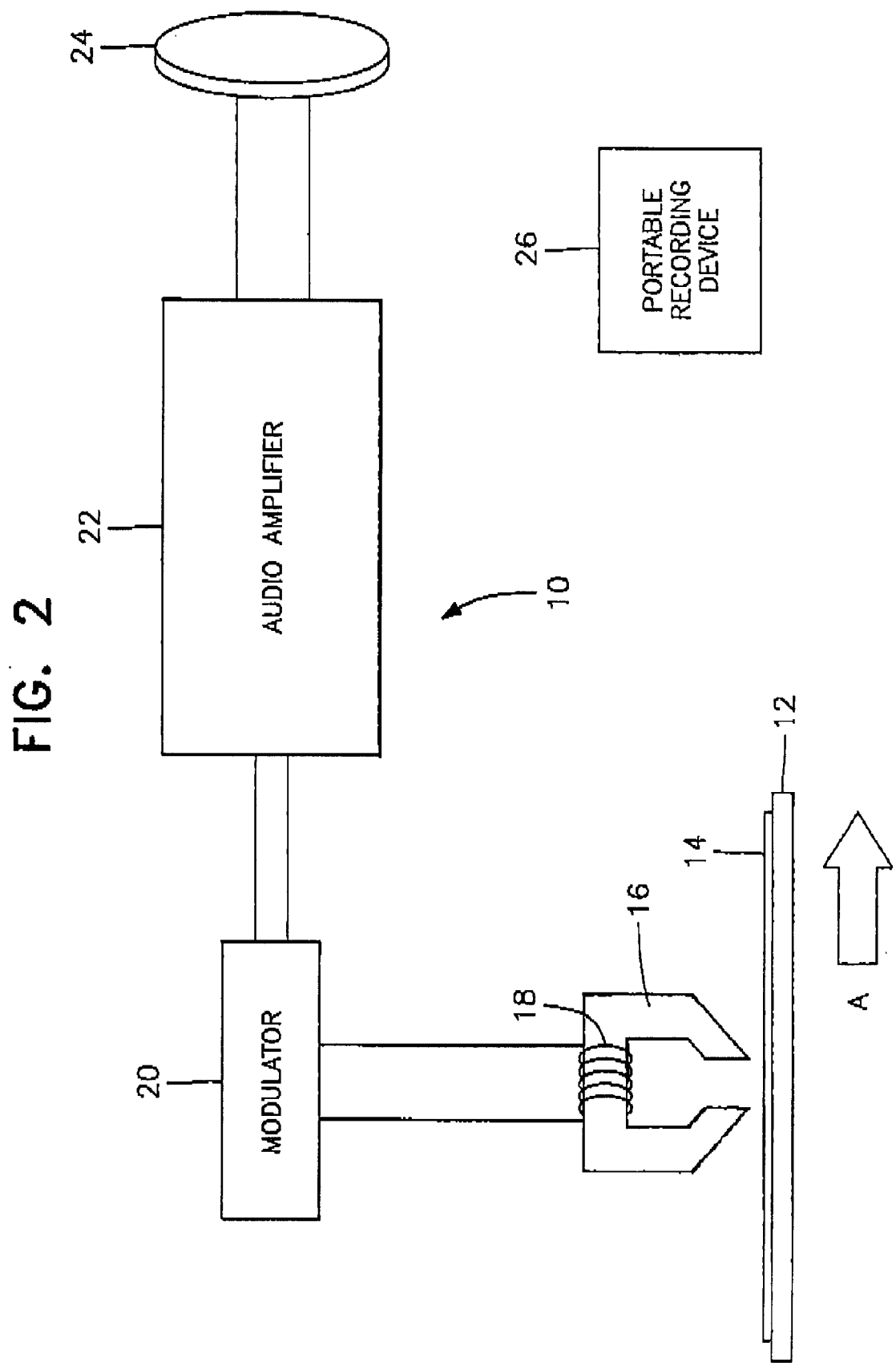
FIG. 2 is a detailed diagram showing the components of the card reader.

As shown in FIG. 2, the reader 10 generally comprises an inductive pickup head 16 having a coil 18, a modulator 20, amplifier 22 and speaker 24. As card 12 is swiped through the reader 10, the magnetic strip 14 passes the inductive pickup head 16. The inductive head 16 reads information from the magnetic strip 14 of the card 12 as it is passed through the slot of reader 10. Information is stored in the magnetic strip 14 by the use of magnetic transitions. A transition in the magnetic direction of the strip 14 represents binary 0's and 1's.

As the card 12 moves past the inductive read head 16, magnetic transitions representing binary data induce a small voltage in the coil 18 of the head 16. The voltage from the coil 18 stimulates the modulator 20 to produce a short burst of audio frequency signal. The audio frequency signal is amplified by audio amplifier 22 and sent to the speaker 24. The speaker 24 is preferably located on the bottom of the reader 10 (of FIG. 1), so that it may be held in close proximity to the microphone of a telephone, for instance. The audio frequency signal is then transmitted electronically over telephone lines to a remote receiver (not shown).

As just described, the card reader shown in FIG. 2 can be used to generate an audio frequency signal emitted by speaker 24 by passing the credit card 12 so that the magnetic strip 14 passes the inductive pickup head 16. Once generated, the audio signal may be recorded on a portable recording device 26 and the recorded signal played back whenever the credit card information needs to be transmitted. The digital audio recording device is small and portable, and can be held close to the telephone mouth piece and operated by pushing a button. The credit card information can be protected from fraudulent use by the use of a pin code actuated circuit so that a pin code must be entered on a key pad connected to electronic switches so that the audio signal can only be played back when a proper pin code has been entered. Such a pin code actuated circuit is described in U.S. patent application Ser. No. 09/028,855, which is incorporated herein by reference.

A single recording device can store the signal from many credit cards. Each credit card must be passed through the card reader and its individual audio signal recorded. The user can choose to use the card signal from a particular card issuer by retrieving and playing back the sound signal from the selected card. A short identifying message is preferably also recorded for each card at the same time the audio signal from the card is recorded.

A credit card transaction using the stored audio signal may be carried out by telephone by the user calling the merchant and placing an order verbally. The user then sends the recorded credit card information as a short audio signal. The merchant receives the credit card information and can confirm that the card is valid with the issuer. The user only needs access to the credit card reader once to record the magnetic strip information. The recording step can be provided as a service by the card issuer or by the merchant. The in-store card readers can be equipped with both conventional magnetic pickup head input as well as microphone audio input so that the user can choose to carry all of his credit cards in recorded audio form for use either in telephone transactions or in-store purchases. When used for an in-store purchase the recording device is held close to the microphone of the in-store reader and the credit card information is played back.

The digital audio recording device can also be incorporated into a cell phone. The recorded credit card data can be transmitted on command through the cell phone communication channel.

Preferably, the inductive magnetic head 16 is of the type used in conventional card readers. As the magnetic strip 14 of the card is moved past the inductive head 16, the vertical component of the magnetic field, $H_z$, of the strip 14 varies as a function of time, FIG. 3. A time varying electric field, E(t), is induced in the windings 18 of the inductive head 16, which in turn are connected to modulator 20. Each magnetic transition signal induces the modulator 20 to emit a short burst of a fixed frequency in the audio or ultrasound frequency range, which is shown in the bottom graph of FIG. 3.

Figure 10:
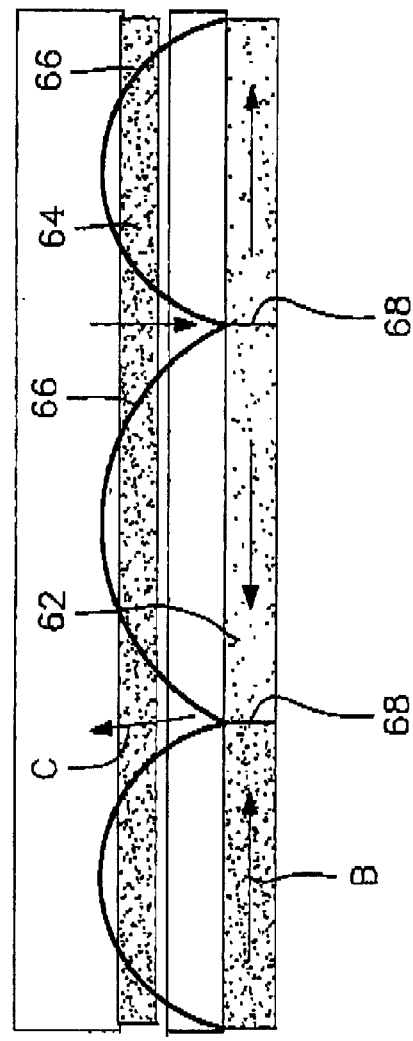
FIG. 10 is cut-away side view of the card of FIG. 9 showing magnetic field lines generated by the magnetic strip.

Magnetic transitions on card 12 are shown, for instance, in FIG. 10. In the first section of the strip 14, the magnetic flux flows toward the right of the page, as represented by arrow B. At the first transition point, the magnetic flux changes direction and flows toward the left side of the page. Accordingly, the magnetic field $H_z$ is directed outward, or positive, as shown by arrow C. The next transition results in an inward, or negative magnetic field.

Figure 3:
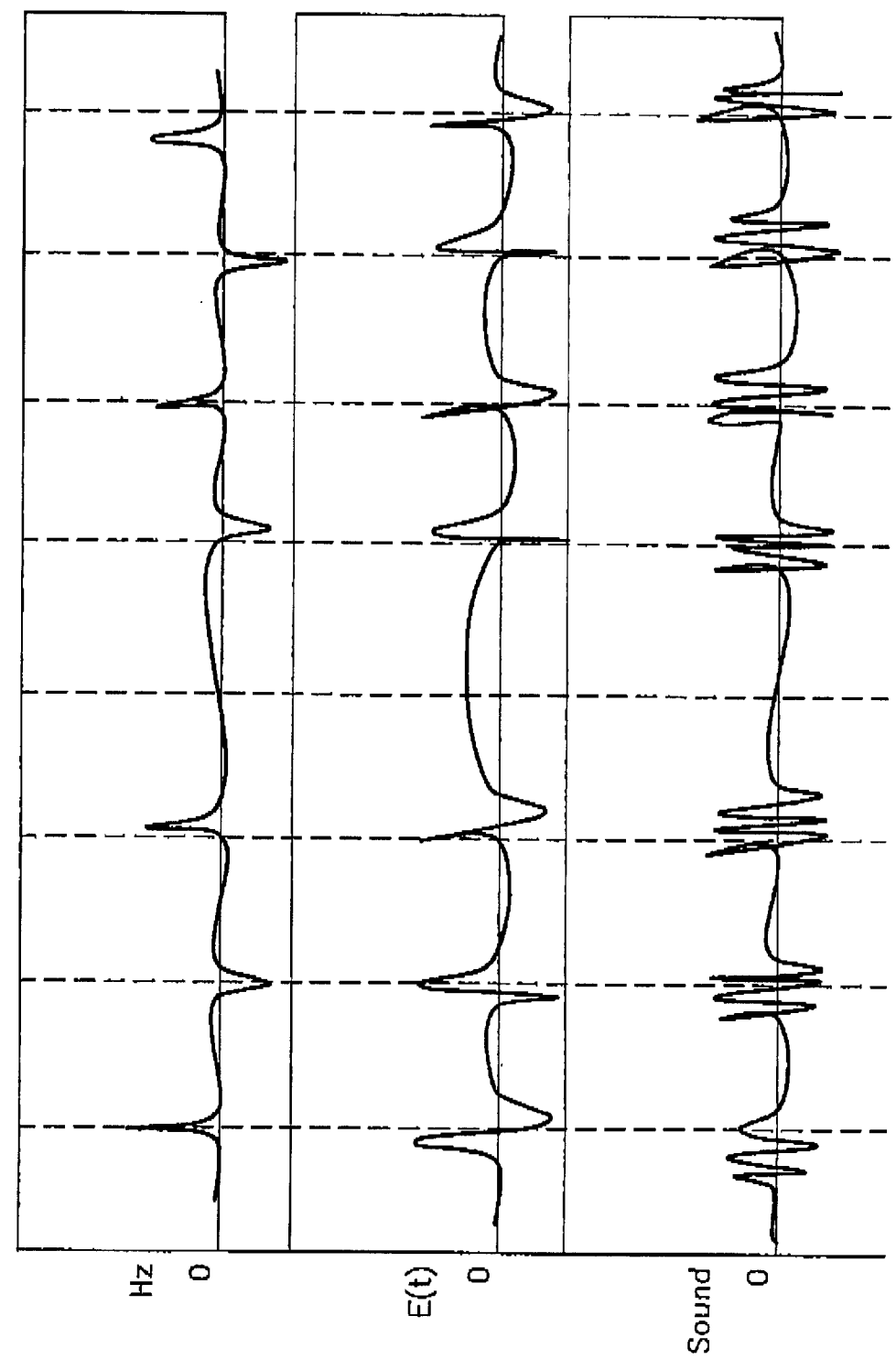
FIG. 3 is a chart of the signals generated by the card reader.

The spacing of data bits on a magnetic card 12 is 5 mils (127 μm) between transitions for a binary zero and 2.5 mils (63.5 μm) for binary one. The transition points for each 2.5 mils are indicated in FIG. 3 by the vertical dashed lines. At the first transition point, the magnetic flux is reversed, resulting in a positive magnetic field. The next transition results in a negative magnetic field, and the magnetic field continues to flip flop until the fourth transition point.

At the fourth transition point, the magnetic flux does not reverse, which is represented by the absence of a magnetic field change. The remote receiver will recognize the time between the reversal of magnetic field to indicate either a binary one or zero. As the magnetic field $H_z$ changes, so does the output of the inductive head 16 E(t) and the short bursts of sound produced by the speaker 24.

The frequency of the signal from the modulator 20 can be in the audio or ultrasound range provided the telephone receiver and lines have sufficient bandwidth to carry the high frequency. A preferred frequency in the audible range is about 1 kHz, though any suited audible frequency may be used, such as in the range of 400–4,000 Hz. A preferred frequency in the ultrasound range is about 40 kHz, though any suited ultrasound frequency may used, such as in the range from 30 to 40 kHz. Any suited signal may be used, such as a DTMF signal. However, a DTMF signal may be obstructed by the presence of a filter.

The short bursts from the modulator 20 at a fixed frequency are then amplified by amplifier 22. Preferably, the amplification is at about 100 mV, or 3 to 100 times amplification of the input signal. The amplified signal is then sent to loudspeaker 24, which emits a series of sound pulses corresponding to the magnetic transitions on the card 12. The sound reaches a microphone (not shown) of a telephone, for instance, which converts the sound pulses to electrical pulses that are sent electronically or telephonically to the remote receiver or to any system that is capable of receiving like signals.

The remote receiver is comprised of a filter that selectively passes the electrical pulses corresponding to the pre-selected frequency of the sound pulses. The short pulses are detected and converted to a series of electrical pulses similar to the original electrical pulses from the inductive head. The pulses are read and recorded using conventional software and computer interface that are used with a conventional magnetic card reader.

In a telephone credit card transaction with the card reader 10 of this invention, the card number, expiration data and card holder's name are preferably sent over the telephone line by the card holder. The information can be verified by the bank that issued the credit card and the approval sent to the merchant. This method allows the card holder to make remote transactions without exposing the card number or other information to the merchant. Furthermore, the information cannot be overheard by third parties that might otherwise be in a position to hear the conversation between the card holder and the merchant. This provides better security for the information.

By the present invention, a computer microphone calling card or a telephone calling card would permit use of a conventional telephone without dialing code numbers which can be overheard and remembered by a nearby observer. Moreover, it is not necessary for the account number or expiration data to be printed on the card at all. Thus, lost and stolen cards could not be used by an unauthorized user other than by a direct transaction with a merchant. In this regard, it is preferred that the user keep the card separate from the card reader.

However, the invention has particular advantages with cards requiring the entry of a PIN number to activate access to confidential information. The card reader may also be provided with a separate authorization code that must be entered by the user to read the card and transmit the sound signals.

The invention may also be used, for instance, for parking garage and door access control. The information from a card can be transmitted from a loudspeaker of the card reader to a microphone location on the door.

FIGS. 4–7 show an alternative embodiment of the invention. In this second embodiment, the card reader 30, FIG. 4(b), has two contact pads 32 and a Hall sensor array 34. The magnetic card 36, FIG. 4(a), on the other hand, has a magnetic strip 38 and a conductor bar 40. The present embodiment is much more compact than the first embodiment shown in FIGS. 1–3. Accordingly, the present embodiment is more portable and can be easily carried in a wallet or purse. The first embodiment is somewhat less portable, and perhaps better suited for use at a person's home or office or for permanent connection to a public telephone or the like.

Hall sensor arrays have been used, for instance in U.S. Pat. No. 5,543,988 to Brady et al. which is herein incorporated by reference, to sense magnetic fields. The Hall sensor array 34 of the present invention is preferably fabricated by etching a thin film of a suitable material with a large Hall effect using photo lithographic patterning.

As noted above, the spacing of data bits on a magnetic card 36 is 5 mils (127 μm) between transitions for a binary zero and 2.5 mils (63.5 μm) for binary one. Preferably then, the individual Hall sensors 42 in the array 34 are located on 10 to 20 μm centers to provide sufficient resolution in transmission spacing to distinguish 1's and 0's.

Figure 6:
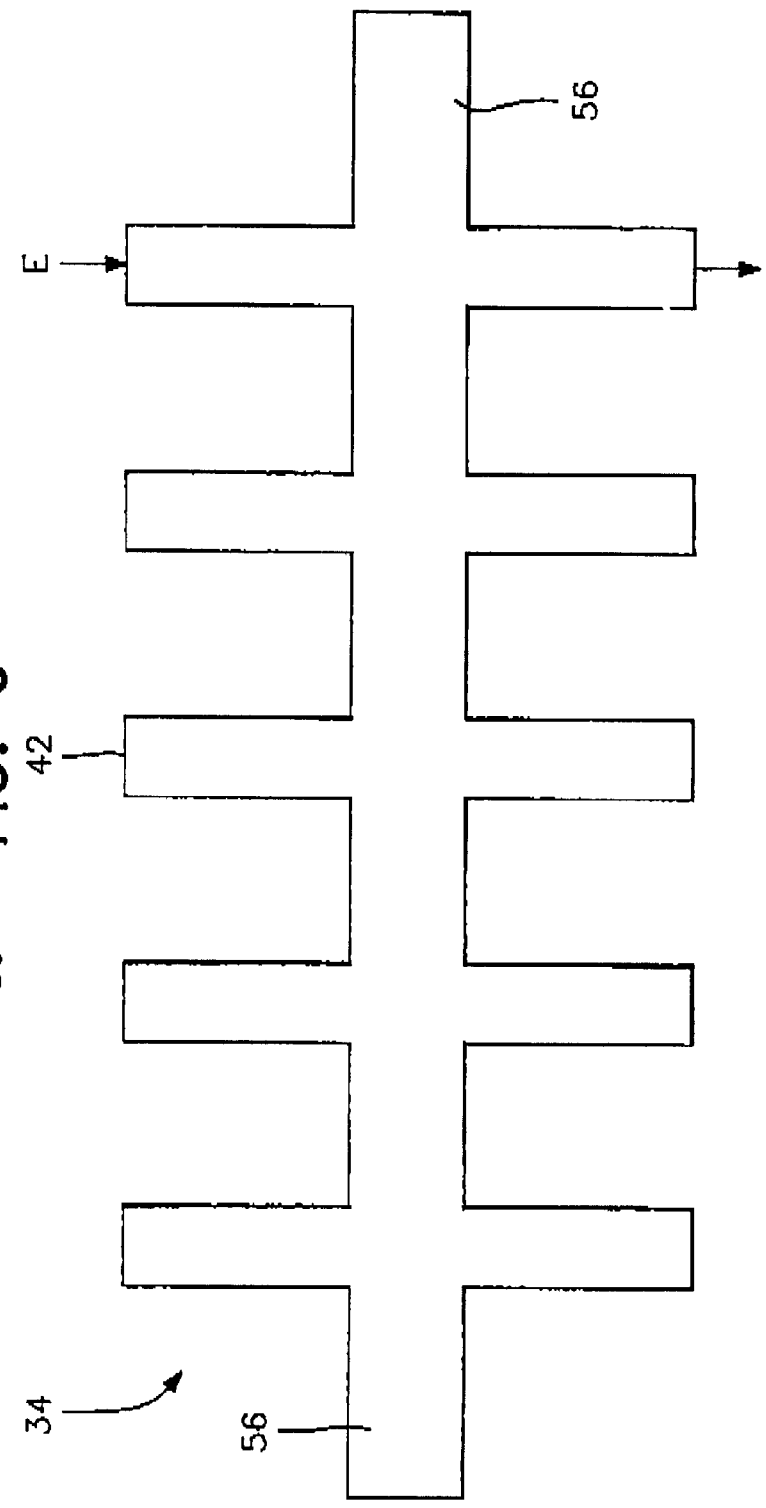
FIG. 6 shows the Hall sensor array for the magnetic card reader of FIG. 4(b).

As best shown in FIG. 6, the sensors 42 are equally spaced and perpendicular to the central connecting bar. The Hall sensors 42 are each connected to a common voltage line and one of the sensor 42 is cross activated by transmitting a current through it, as indicated by arrow E. The sensors 42 are each approximately 10 μm wide.

Figure 5:
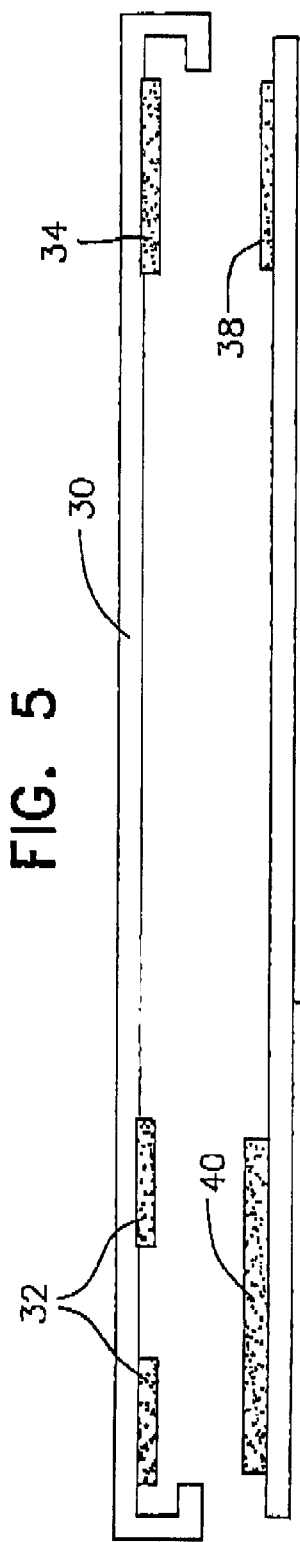
FIG. 5 is a side view of the magnetic card of FIG. 4(a), together with the card reader of FIG. 4(b).

FIG. 5 shows the relationship between the contact pads 32 and conductor bar 40, as well as between the Hall sensor array 34 and the magnetic strip 38. The conductor bar 40 and contact pads 32 are located so that they align with each other. In this position, the Hall sensor array 34 is also aligned with the magnetic strip 38.

When the card reader 30 and card 36 are pressed together with the proper orientation, the conductor bar 40 is brought into contact with the two contact pads 32. The conductor bar 40 completes a circuit in the reader 30 through the contact pads 32, turning on the power supply of the reader 30. Current is then supplied to the Hall sensor array 34 and amplifier 44. Hence, the conductor bar 40 not only operates to align the magnetic strip 38 with the Hall sensor array 34, but to activate the reader 30 to generate the sound signal.

Thus, in the preferred embodiment, it is not necessary to maintain power to the electrical circuit at all times. Rather, a "wake up" circuit is activated that turns on the power for sufficient time (100 msec to 1 sec) to send the data stream repeatedly. The reader 30 may then automatically be powered down, or may enter a sleep state. When the card 36 and reader 30 are separated, the circuit is broken by the loss of contact between conductor bar 40 and contact pads 32, and the reader 30 is turned off.

Figure 4A:
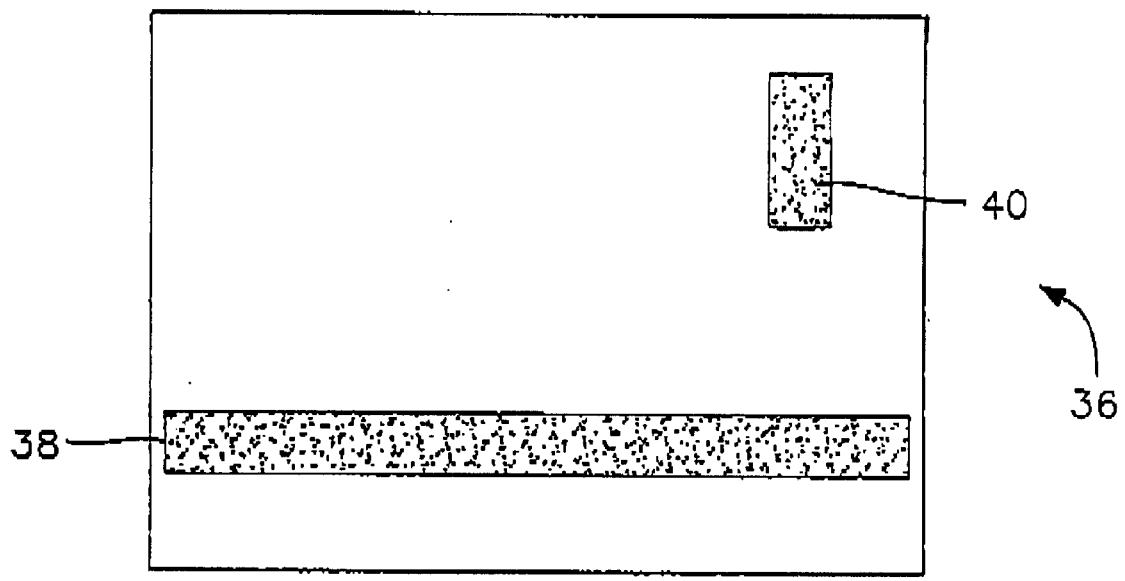
FIG. 4(a) is a bottom view of a magnetic card in accordance with a second embodiment of the invention.
Figure 4B:
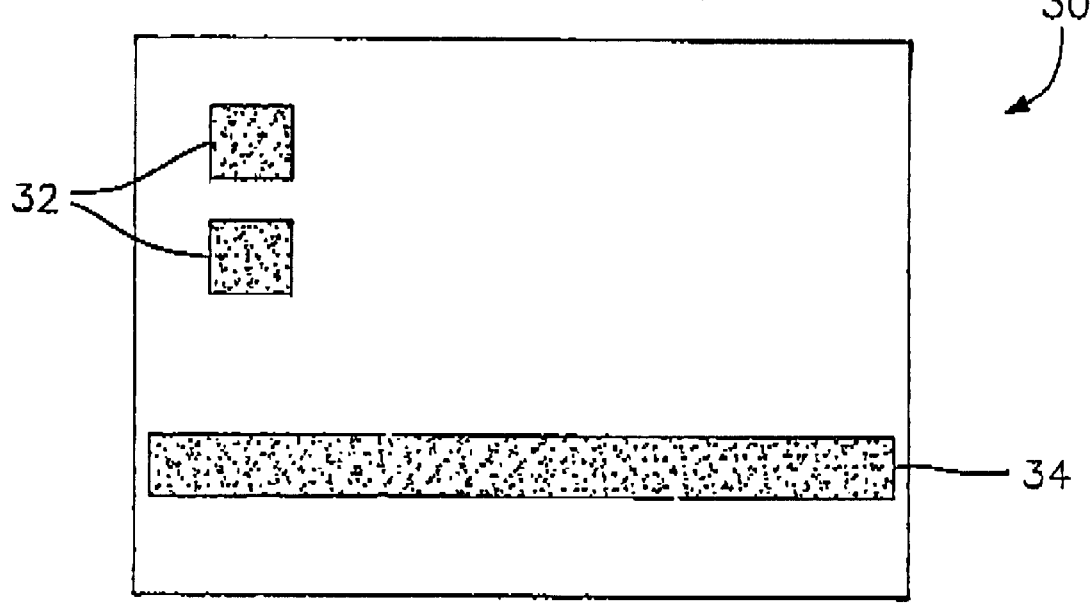
FIG. 4(b) is a top view of a magnetic card reader used in connection with the second embodiment of the invention.
Figure 4C:
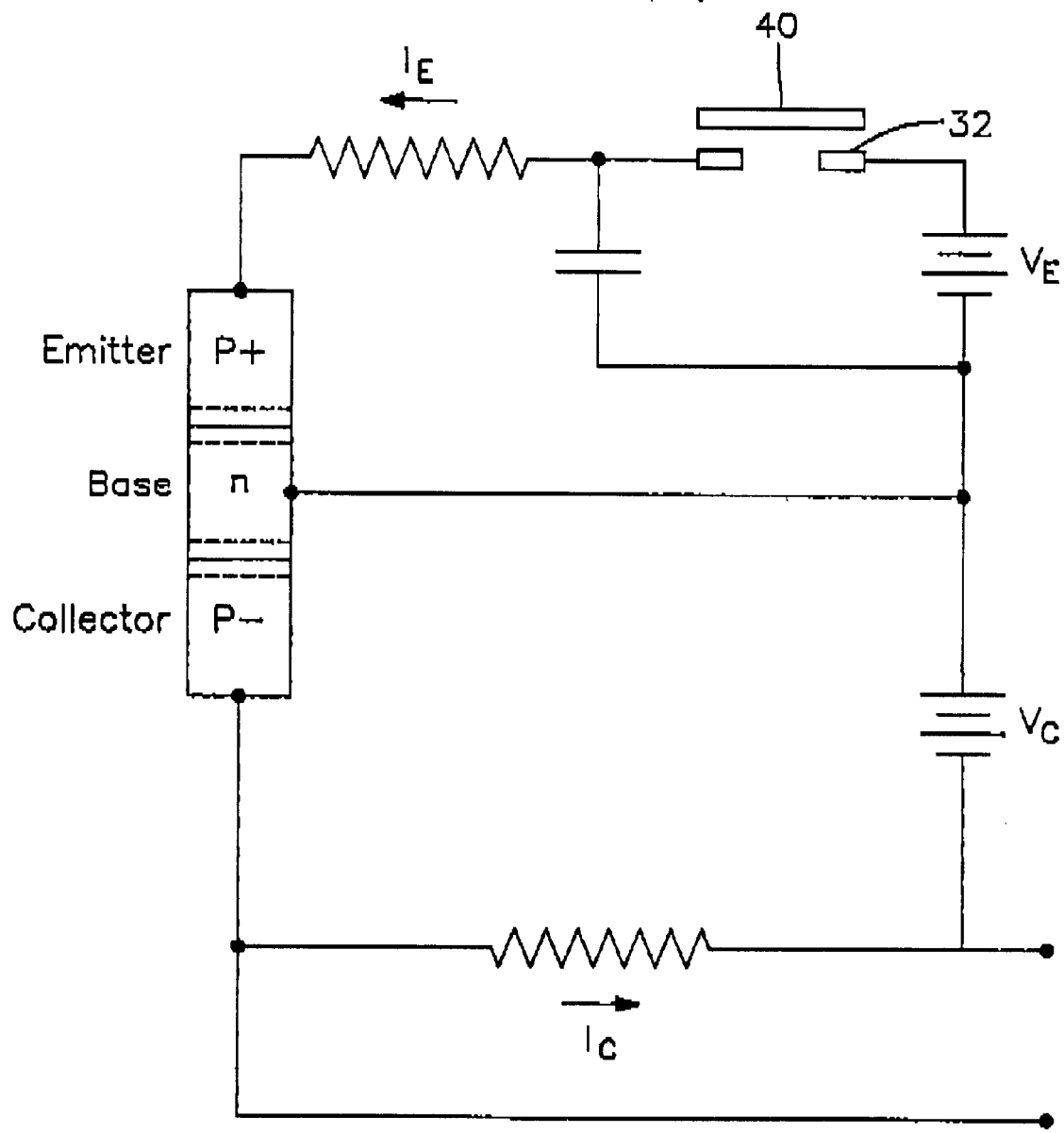
FIG. 4(c) is a circuit diagram showing the electronic operation of the card reader.

Turning to FIG. 4(*c*), the circuit diagram shows the "power up" circuit, and the relationship between the conductor bar 40 and contact pads 32. As conductor bar 40 comes into contact with contact pads 32, the circuit is activated. The battery $V_E$ connects to the circuit to charge the capacitor and induce a current $I_E$ to operate the transistor. Accordingly, the transistor acts as a switch that connects the second battery $V_C$ that in turn induces current $I_C$ and operates the device.

In the preferred embodiment of FIG. 5, the sides of the reader 30 have a C-shape defining elongated slots. The card 36 may then easily be aligned with the reader 30 by sliding the card 36 into the slots. The C-shaped configuration also facilitates storing the card 36 in the reader 30 during periods of non-use. In order to de-activate the reader 30 while not in use, the card 36 need simply be turned over or be inserted in a reverse direction so that the conductor bar 40 does not contact the contact pads 32.

In an alternative embodiment, a mechanical switch may be used instead of the conductor bar 40 and contact pads 32. The switch may be placed on the reader 30 and depressed when the card 36 is properly aligned with the reader 30. The switch may be provided, for instance, within one or both of the slots. The switch would then operate to activate the reader to read the information stored on the magnetic strip 38 and generate a sound signal. The reader 30 may power down automatically after the information is transmitted, or power down upon removal of the card 36. Still yet, a notch may be placed in the edge of the card so that the reader is only activated when the switch is not aligned with the notch.

The conductor bar 40 is preferably in the form of a thin film of an electrical conductor, such as a metal film on a polymer foil substrate to provide a flexible electrically conductive strip. Alternatively, a metal foil may be used. The bar 40 is further provided with an adhesive backing. Thus, any magnetic card 36 can be adapted to be used with the card reader 30 simply by placing the conductive strip 40 at the proper position on the card. In new cards, a rectangular bar of metal foil can be molded into the back of the card in the appropriate position.

Figure 7:
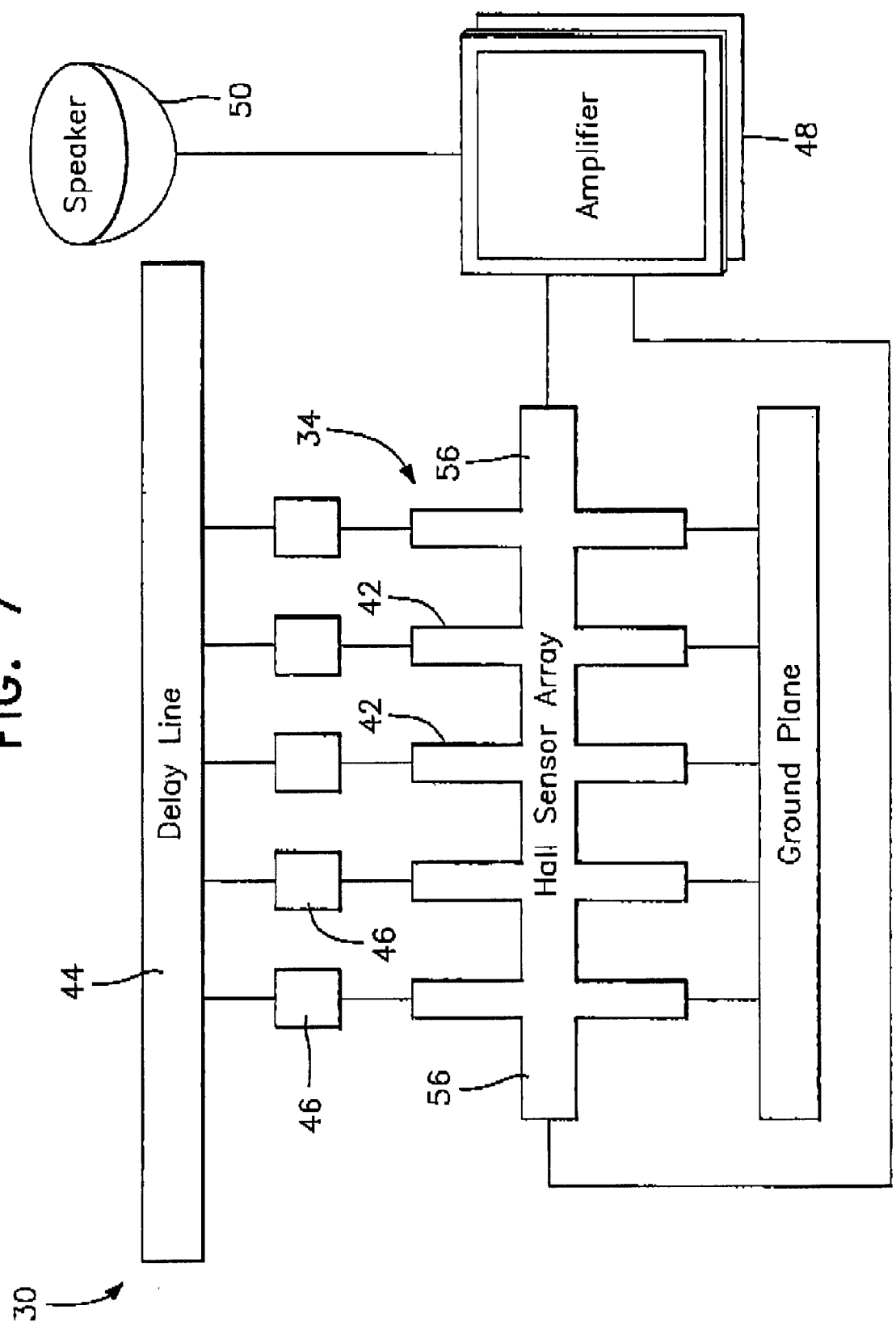
FIG. 7 is a block diagram of the magnetic card reader.

The Hall sensor array 34 requires a current in order to produce an electric field $E_Z$ perpendicular to the plane defined by the direction of current flow and the magnetic field direction. As shown in FIG. 7, a delay line 44 is used to control the flow of current to the individual Hall sensors 42 in the array 34 so the sensors 42 are activated in a sequential manner. The output of the array 34 thus has a time dependence which simulates the time dependent signal produced by a conventional inductive head card reader, such as shown in the embodiment of FIGS. 1–2.

The delay line 44 is used to control current sources 46 so that the Hall sensors 42 in the array 34 are activated sequentially. Thus the Hall voltage at the ends of the sensor array 34 has a time dependence similar to that of a conventional inductive head magnetic card reader. The delay line 44 can be activated repeatedly so the information content of the card is read many times for error correction.

The delay line 44 preferably comprises parallel shift registers that are clocked by a common source. Each Hall sensor cross is associated with a shift with one shift register to operate as a first-in-first-out (FIFO) memory. Accordingly, the data stream provides a voltage pulse at Gate 1 at $t_1$, at Gate 2 at $t_2$, etc., in order to provide a current pulse through Hall cross 1 at $t_1$, Hall cross 2 at $t_2$, and so forth.

Current sources 46 preferably comprise monolithic MOS switches that are used as gates. The base is connected to the delay control line, and the remaining ends are connected to the power supply and Hall sensor array.

The signal output from the Hall sensor array 34 can thus be received and processed by the same hardware and software as is used in existing card readers that are hard wired to telephone lines. The output voltage from the Hall sensor array 34 is amplified by amplifier 48 and transmitted as a sound signal by a loudspeaker 50 or similar transducer of electrical signals to sound waves.

The loudspeaker 50 is preferably located in proximity to the mouth piece of a telephone to send the confidential information to a remote location. In the embodiment of FIG. 4(*b*), the speaker 50 would be located on the reverse side of the reader 30 so as to be readily accessible to the telephone microphone.

Because the Hall array is a thin film, the reader 30 is approximately the size and shape of a credit card. A thin format, thin film type battery (not shown) is used to provide the current for the Hall sensor array 34, delay line 42, amplifier 48 and the loudspeaker 50.

The Hall sensors are preferably made of a semiconductor, such as silicon, germanium or indium antimonide. However, the Hall coefficient of semiconductors is small unless they are high quality signal crystals. Ferromagnetic metals in the form of thin films with amorphous structure have been shown to have a large Hall coefficient at magnetic saturation. The amorphous magnetic films can be easily deposited onto polymer substrates by vacuum evaporation, sputtering or electroless or electrodeposition.

The Hall sensors of amorphous magnetic material produce a large Hall voltage in a small magnetic field if they have a perpendicular easy axis magnetic anisotropy. Such films saturate in a small magnetic field perpendicular to the plane of the film. Magnetic anisotropy can be induced in amorphous magnetic materials during the deposition process. The deposited films are patterned into a linear array of Hall crosses by lithographic processing. Photolithography is commonly practiced in the electronics industry to pattern thin films of metals used for conductors on semiconductor and magnetic devices.

The information stored on the magnetic strip 38 consists of a pattern of magnetized regions 25 μ wide by 3 mm long arranged perpendicular to the long axis of the strip. The spacing between these magnetized regions is 127 μm for binary zero and 63.5 μm for binary one. The Hall sensor array 34, therefore, places a Hall sensor 42, which is about 10 μm wide, at 20 μm spacing in order to pick up the field lines 66 (FIG. 10) generated from the transitions 68 on the magnetic strip 38. Hence, a total of 4000 Hall crosses 42 are needed in the linear array 34 to cover the 80 mm length magnetic strip 38 of a typical magnetic card 36.

The Hall sensors 42 respond to the vertical or Z-component of the magnetic field of a magnetic bit, as does a conventional inductive pickup head in a magnetic card reader. As current passes through the Hall sensor 42, the current is affected by the field lines 66 generated by transitions 68. If a transition 68 occurs, a voltage will result on voltage lead lines 56.

In an alternative embodiment, an array of magnetoresistive sensors can be used in place of the Hall sensors. However, the magnetoresistive sensors respond most efficiently to the in-plane or X and Y components of the magnetic field of a magnetic bit. Hence, the decoding software for recognizing "1's" and "0's" would have to be modified to detect magnetic transition from the X-Y field changes. In order to sense the Z component, the magnetoresistive sensor would have to be oriented with the plane of the thin film sensor perpendicular to the surface of the magnetic strip. A sensor array of this type cannot be made by a simple lithographic patterning and etching process.

Figure 8:
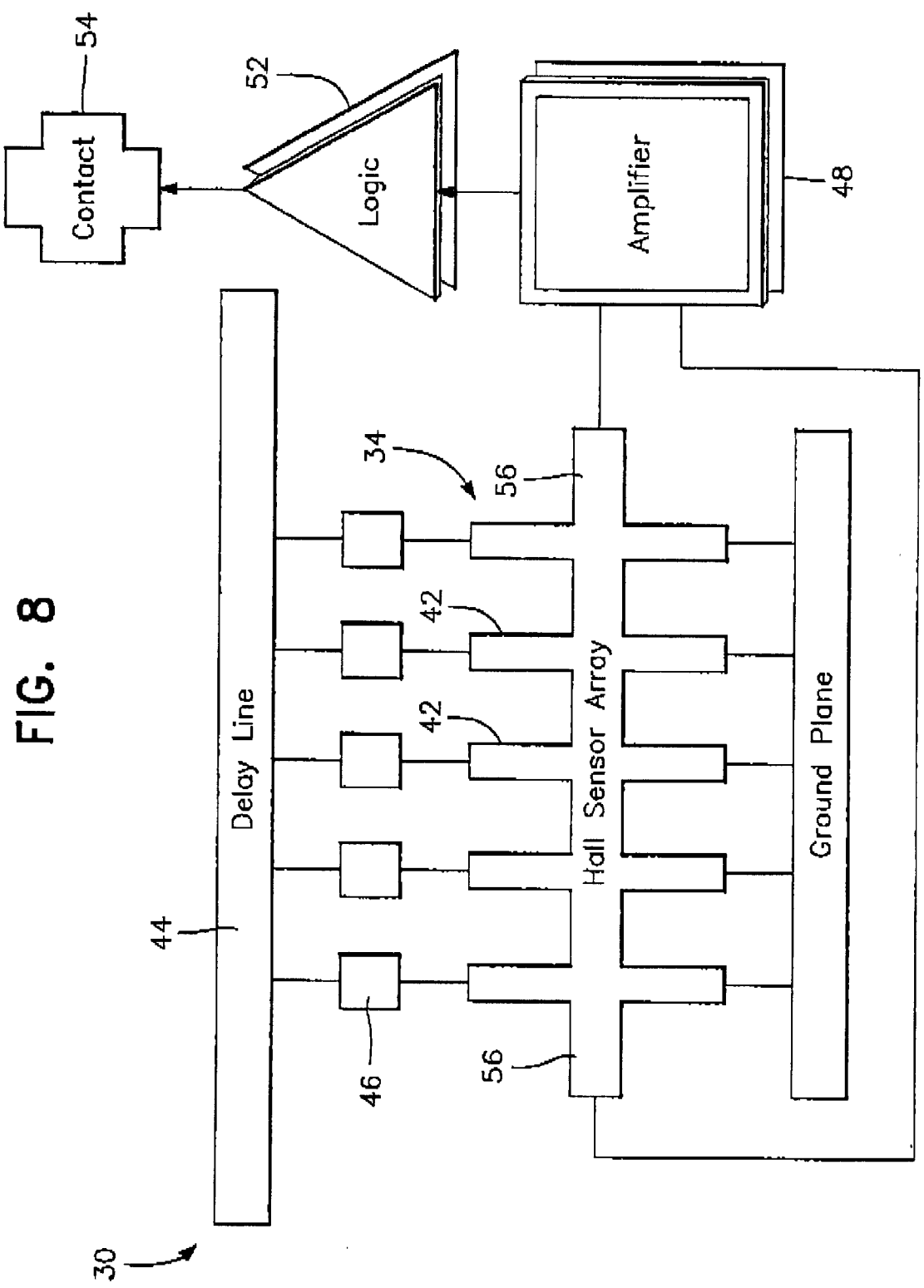
FIG. 8 shows a card reader for reading information from both magnetic and smart cards in accordance with a third embodiment of the invention.

Turning to FIG. 8, an alternative embodiment is shown, wherein the data is sent as a sequence of electrical pulses to emulate a smart card. The information obtained from the magnetic strip 38 of the magnetic card 36 is put into a format which can be processed by an electronic smart card reader. The card reader 30 generally comprises a Hall sensor array 34, delay line 44, current control sources 46, amplifier 48, logic 52 and contact 54.

The control of the Hall sensor array 34 is the same as for FIG. 7. Now, however, the amplified signal is processed by a logic circuit 52 that outputs a signal in the format used by an electronic smart card at contact point 54. The smart card reader (not shown) interfaces with reader 30 at contact 54. Hence, the present embodiment converts information read from a magnetic card to a smart card data format. This magnetic card to smart card data converter makes it possible for holders of magnetic cards to carry out transactions on smart card reader devices.

In addition, the features of both FIGS. 7 and 8 may be combined into a single reader having a speaker 50 (FIG. 7), as well as logic circuit 52 and contact 54 (FIG. 8). This combined reader is then able to output information read from a magnetic card in both sound as well as smart card format. The amplifier 48 would simply be connected to both the speaker 50 and to the logic circuit 52.

Figure 9:
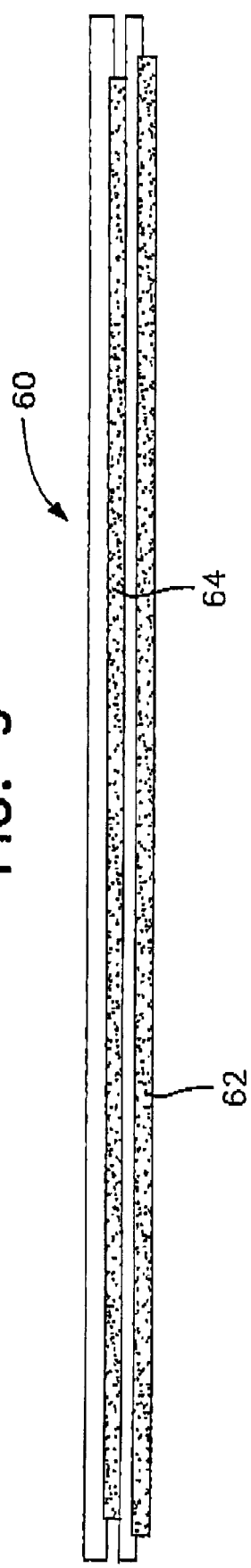
FIG. 9 is a cut-away side view of a card having both a Hall sensor array and a magnetic strip in accordance with a fourth embodiment of the invention.

FIGS. 9 and 10 show another embodiment of the invention consisting of a Hall array card reader and a magnetic data storage card combined into a single card/reader 60. The card/reader 60 has both a magnetic strip 62 and a Hall sensor film 64. The card 60 is provided with an amplifier and speaker device for transmission of data by sound as well as "smart card" type electronic data readout. The combined card/reader 60 provides transmission of data by sound as well as compatibility with a smart card electronic reader.

The card 60 is constructed by depositing a Hall sensor array 64 on a polymer substrate that is laminated to the back of the polymer substrate supporting the magnetic strip 62. FIG. 10 shows the magnetic field 66 distribution near a magnetic bit or transition 68. The vertical component of the magnetic field 66 passes through the polymer and is sensed by the Hall sensors in the array 64.

Figure 15:
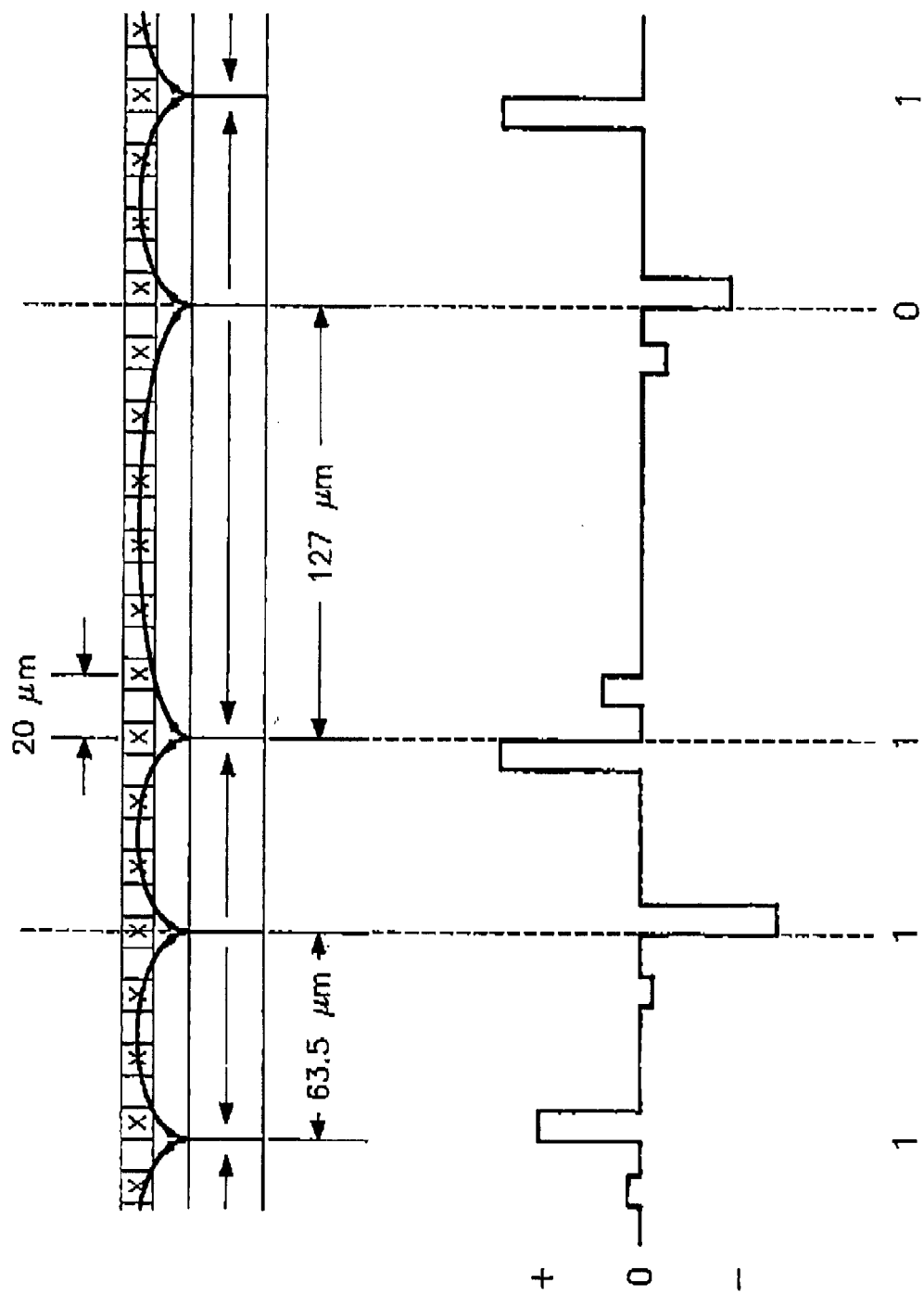
FIG. 15 is a diagram of the transition, magnetic field lines and resulting pulses generated by the Hall sensor array.

FIG. 15 is a more detailed diagram of the relationship between the individual Hall crosses (marked with an X), the magnetic data bits or transitions (represented by the arrows) and the field lines. As depicted by the drawing, the Hall sensors are only sensitive to the up or down field components. The spacing of the Hall crosses (20 μm) is smaller than the spacing between the transitions (63.5 μm for ones and 127 μm for zeros). The small $V_H$ pulses are due to whether the Hall crosses are directly aligned with the transition points, or slightly offset.

Figure 16:
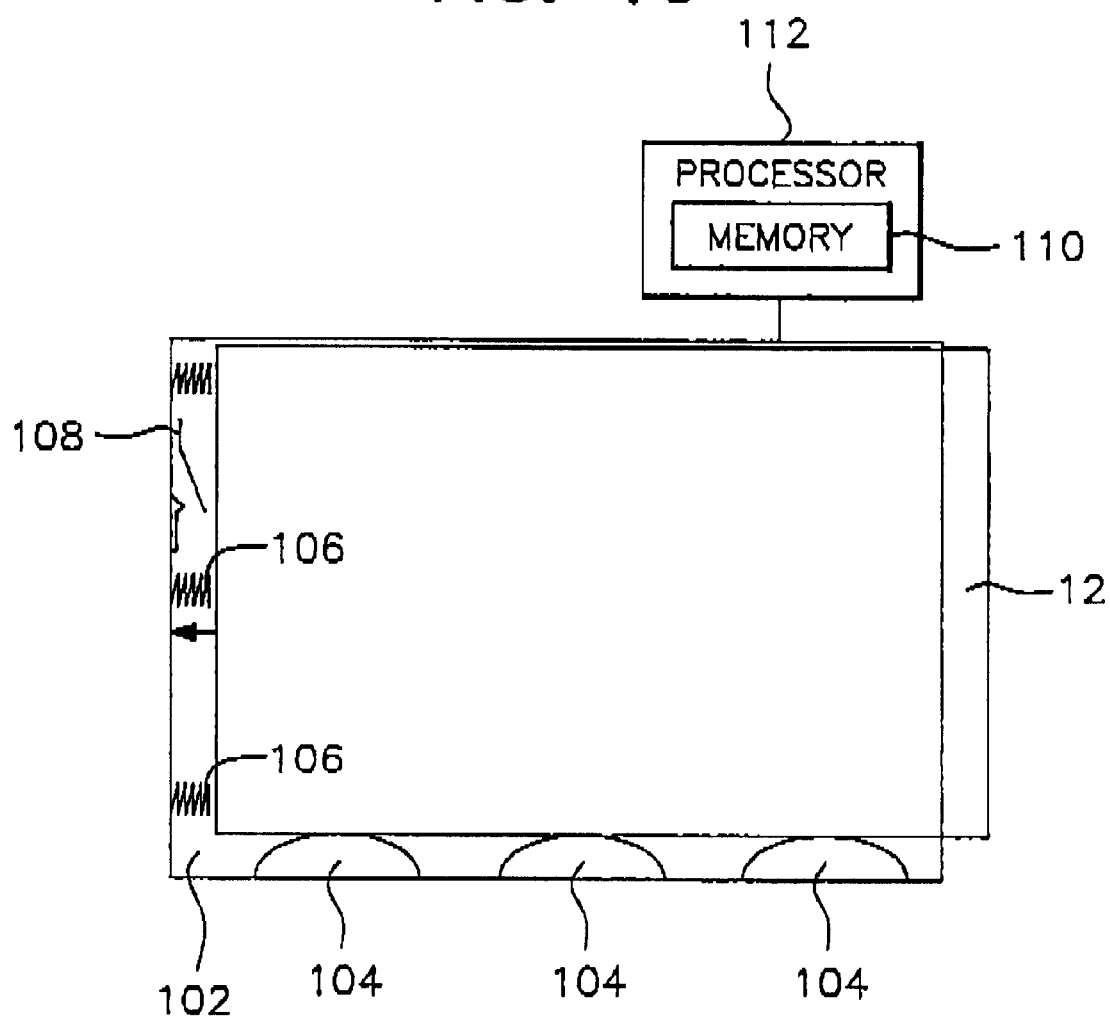
FIG. 16 is a diagram of a card reader configured to reduce the number of Hall sensors needed for data scanning in accordance with an embodiment of the present invention.

The Hall sensor array shown in FIG. 15 has 10 micron wide Hall sensors 42 at 20 micron spacing for a total of 4000 Hall crosses to cover the 80 mm length of the magnetic strip. To reduce the number of Hall sensors needed, an alternative embodiment allows the array to be scanned a short distance (about 2 mm) so that each Hall sensor reads the data on a small fraction of the magnetic strip. For example, an array of 80 Hall sensors on 1 mm spacing can be used to read an 80 mm long magnetic strip. The Hall sensor may be located in the reader 102, as shown in FIG. 16. The reader is provided with springs 106, which are compressed when the card 12 is inserted in the reader 102. A contact switch 108 is also located so that when the card is inserted to the limit of its travel, with the aid of low friction positioning guides 104, and the springs 106 are compressed, the switch 108 is closed. When the switch is closed, current is supplied to the Hall sensor and the circuits used to read, amplify and store the Hall voltages detected are activated. When the credit card is released, the springs 106 push the card back about 2 mm. As the card moves back, each of the 80 Hall sensors scans over a 2 mm portion of the magnetic strip, producing a series of voltages which are recorded as a data stream in a memory chip 110. The entire data stream from the magnetic strip can then be reconstructed, using a processor 112, by comparing each of the 80 individual data streams with the adjacent one and combining and matching overlapping data sets.

The thin film battery, delay line circuitry and semiconductor integrated circuit (not shown) may all be laminated into the card 60. The memory chip 110 and processor 112 may also alternatively be incorporated into the card 60. When the card 60 functions as a smart card, the circuitry can be powered from the electronic connection between the card 60 and the electronic reader. A small contact switch may be used to activate the battery for transmission of data by sound.

The card 60 of the present embodiment can also function as a magnetic smart card. A magnetic inductive write head is provided at the card reader. After an electronic transaction is completed, updated information can be written on the magnetic strip 62 by activating the write head. For example, an account balance or the remaining value of a money card can be entered as the card is removed from the smart card reader. The recorded information is nonvolatile, as is all magnetic storage media, so the information can always be retrieved either magnetically or electronically.

Figure 11:
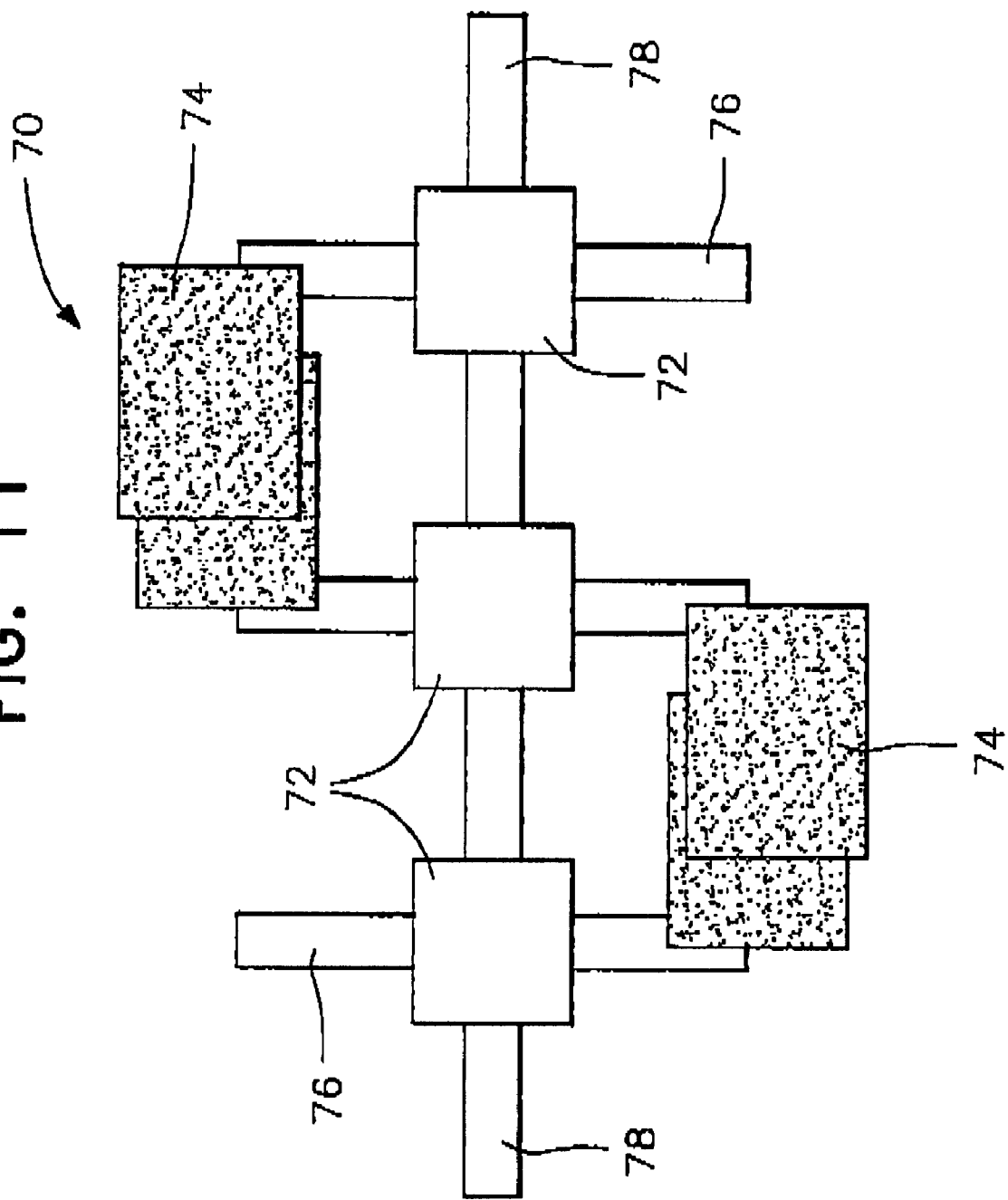
FIG. 11 is an alternative embodiment of the Hall sensor array having an RC delay circuit.

FIG. 11 shows an alternative embodiment of the Hall sensor array 70 incorporating an RC delay circuit. The array 70 has Hall sensors 72, capacitors 74, current lead lines 76 and voltage lead lines 78. The array 70 is configured to maximize the current passing through the Hall sensor 72 from the top current lead line 76 to the bottom lead line 76, while at the same time allowing voltage to be recognized at voltage lead lines 78.

In the conventional Hall sensor array, there is a parasitic flow of current in the X-direction as current passes through the current lead lines 76 to the Hall sensor 72. The present invention reduces the loss of current by coating the current leads 76 with a better conductor material than the voltage lead lines 78 and the lines connecting the Hall sensors 72. The better conductor material enhances the flow of current in the Y-direction. Thus, current flow is guided from the top current lead 76, through the Hall sensor, to the bottom current lead 76.

Figure 12:
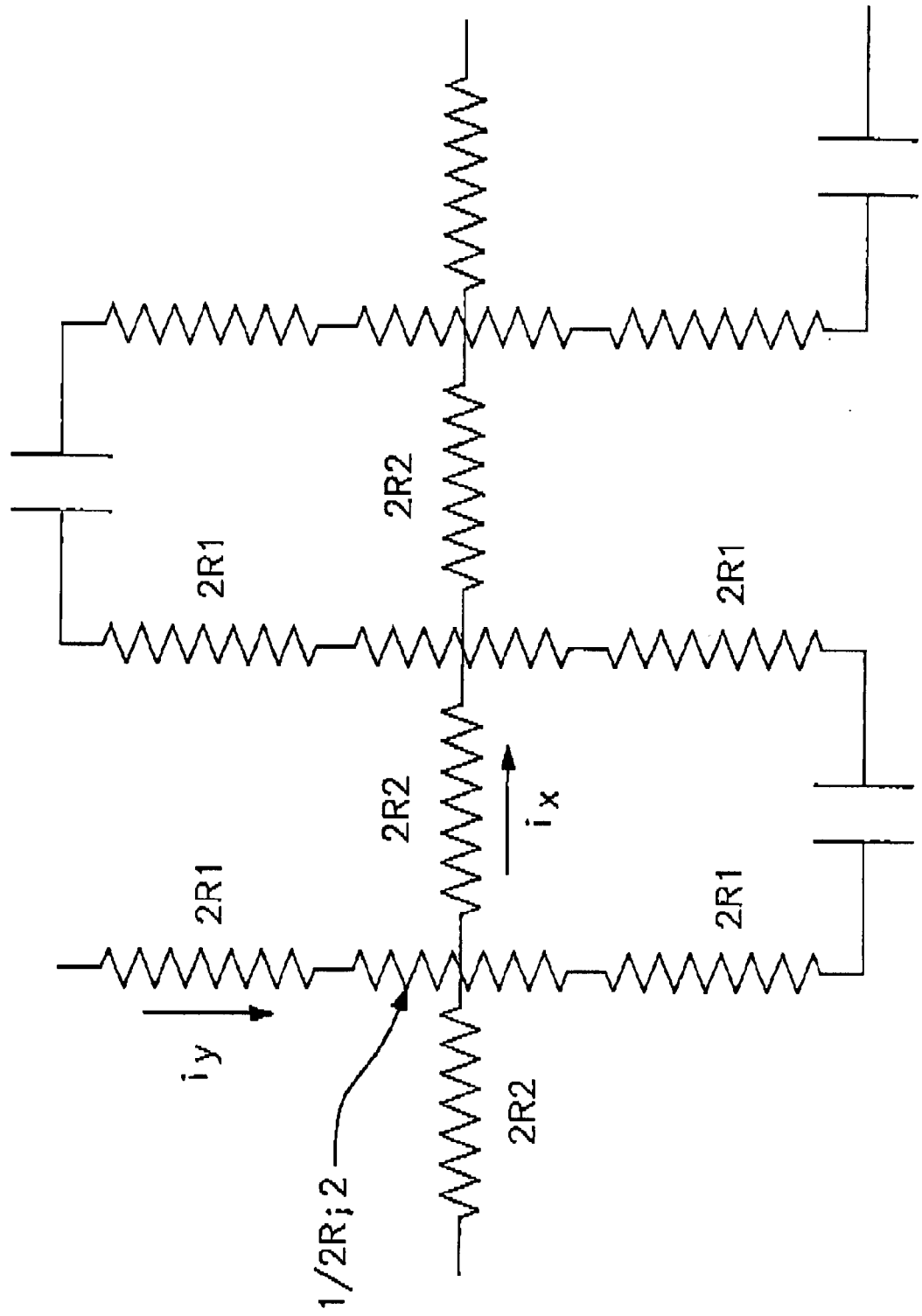
FIG. 12 is a circuit diagram for the Hall sensor array of FIG. 11.

A preferred circuit diagram is shown in FIG. 12, where ½ R2 represents the Hall sensor 72. The value for R2 is approximately 100 times that of R1, so that the current in the Y-direction, across the sensor 72, $i_y$, is much greater than the current in the X-direction, $i_x$. The Hall sensor 72 preferably consists of an amorphous alloy film: Co 85 atomic %, Gd 15 atomic %. The film thickness is about 0.1 $\mu$m having an electrical resistivity of about 100 $\mu\Omega$/cm. The enhanced conductive material is preferably a crystalline Cu film having a thickness of 1.0 $\mu$m and a resistivity of 10 $\mu\Omega$/cm.

Figure 13:
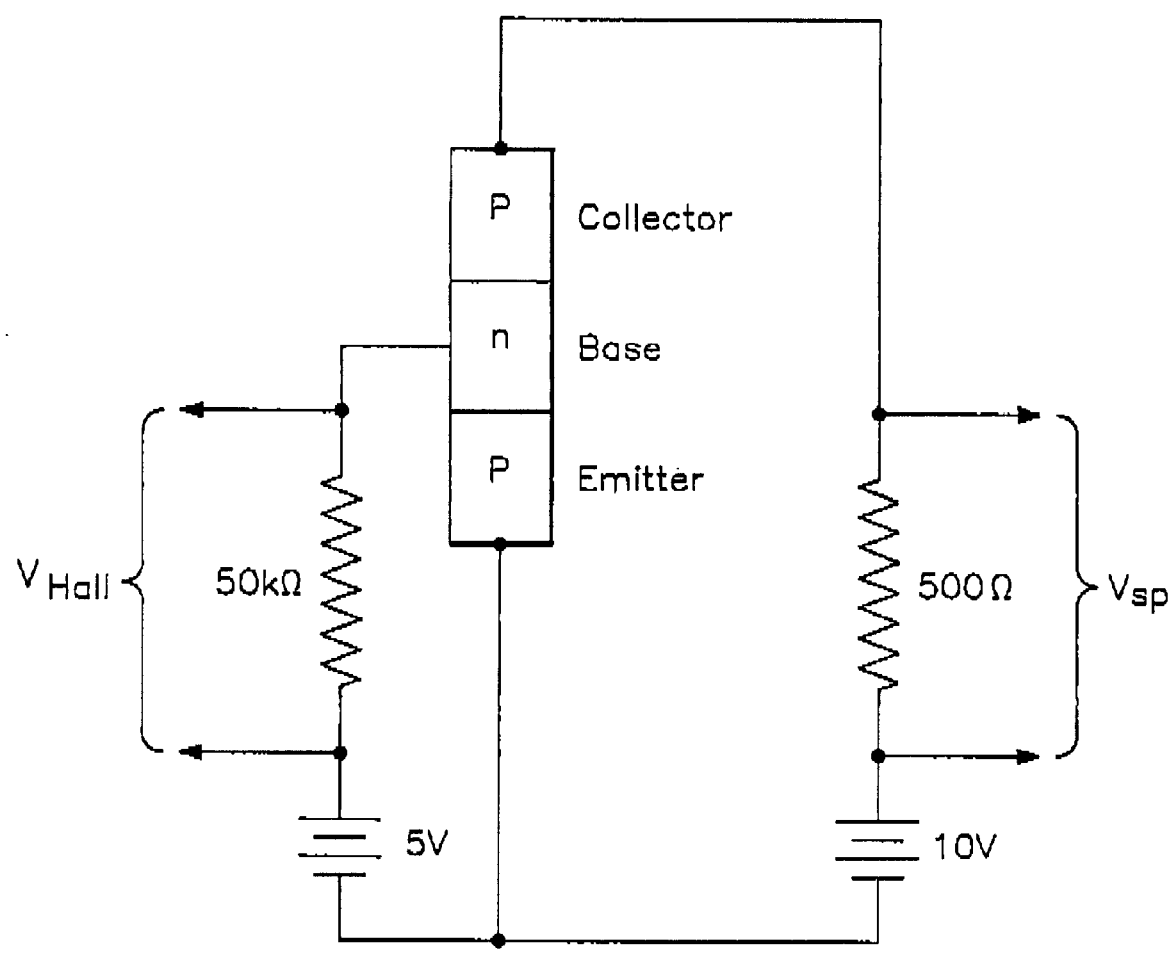
FIG. 13 is a circuit diagram for the amplifier.

FIG. 13 shows the preferred embodiment of the amplifier 48 used in the embodiments of FIGS. 7 and 8 in greater detail. The amplifier 48 comprises a common emitter circuit, in which $V_{Hall}$ represents the voltage to the Hall sensor array and $V_{sp}$ represents the voltage to the speaker. The Hall voltage $V_H$, when added to the bias voltage from the 5V battery, causes the narrow base region (B) to conduct holes. The current flowing through the 500$\Omega$ resistor causes a voltage drop across the resistor which drives the speaker. The Hall voltage signal is amplified because a small change in base-emitter voltage (B-E) near the threshold causes a large change in current in the emitter-collector (E-C) circuit.

Figure 14:
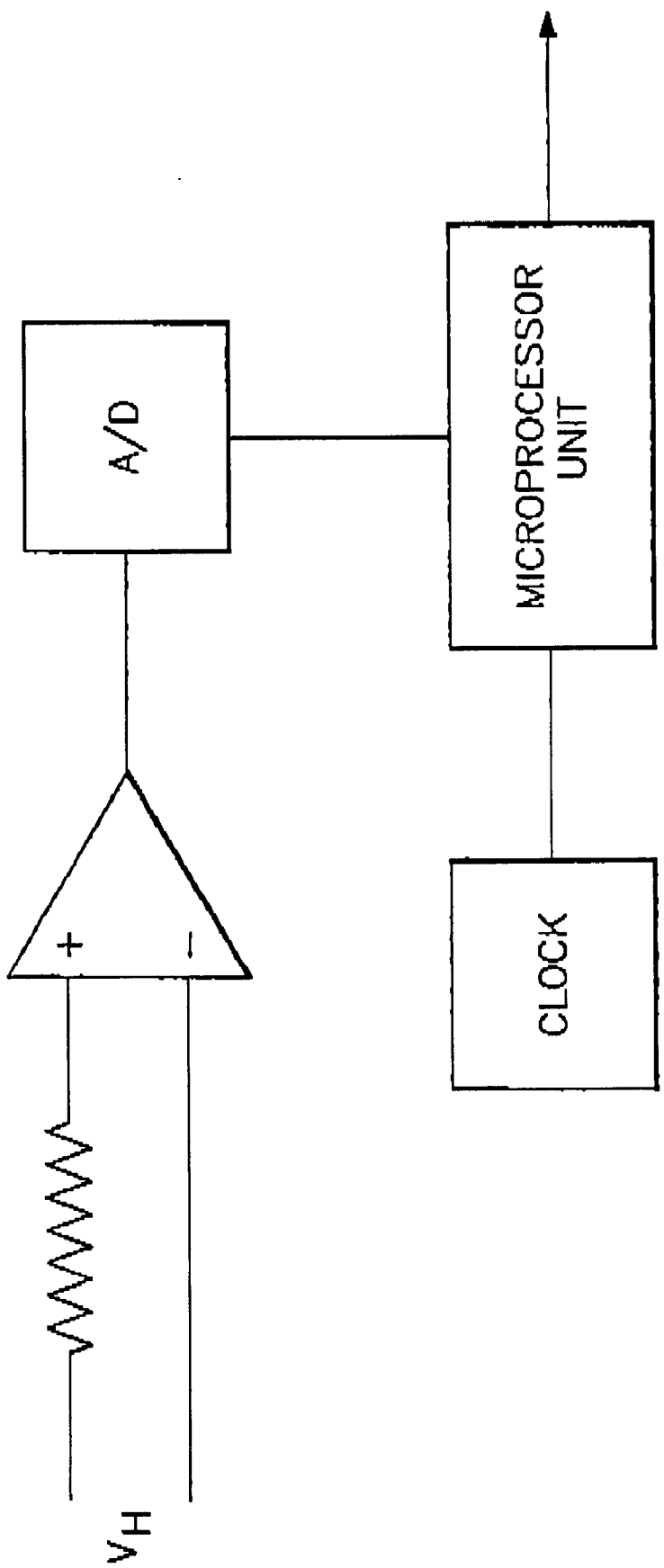
FIG. 14 is a circuit diagram for the logic circuit.

FIG. 14 represents the preferred embodiment for the logic circuit 52 of FIG. 8. The logic is a microprocessor unit, system clock, analog-to-digital (A/D) converter and a comparator circuit. The output of the microprocessor is in the form of digital data having conventional format for smart cards.

The present invention is further directed to a card reader using a magnetic sensor based on magnetoresistive sensing of the magnetic transitions of the magnetic stripe. The magnetoresistive card reader uses conductors that display a change in electrical resistance when exposed to a magnetic field. If a current is passed through the magnetoresistive material the change in resistance can be detected as a change in voltage drop across the magnetoresistive sensing element.

Magnetoresistive sensing elements are commonly used in magnetic digital data storage devices including magnetic tape and magnetic disk storage. A well known magnetoresistive material is an alloy of nickel and iron called Permalloy. A commonly used alloy composition is Ni 81 atomic percent, Fe 19 atomic percent. Permalloy and a number of other magnetic alloys of the transition metals display anisotropy magnetoresistance. The use of anisotropic magnetoresistance (AMR) was first proposed for magnetic recording in 1971, and has been used in digital tape recording since 1985.

Figure 17:
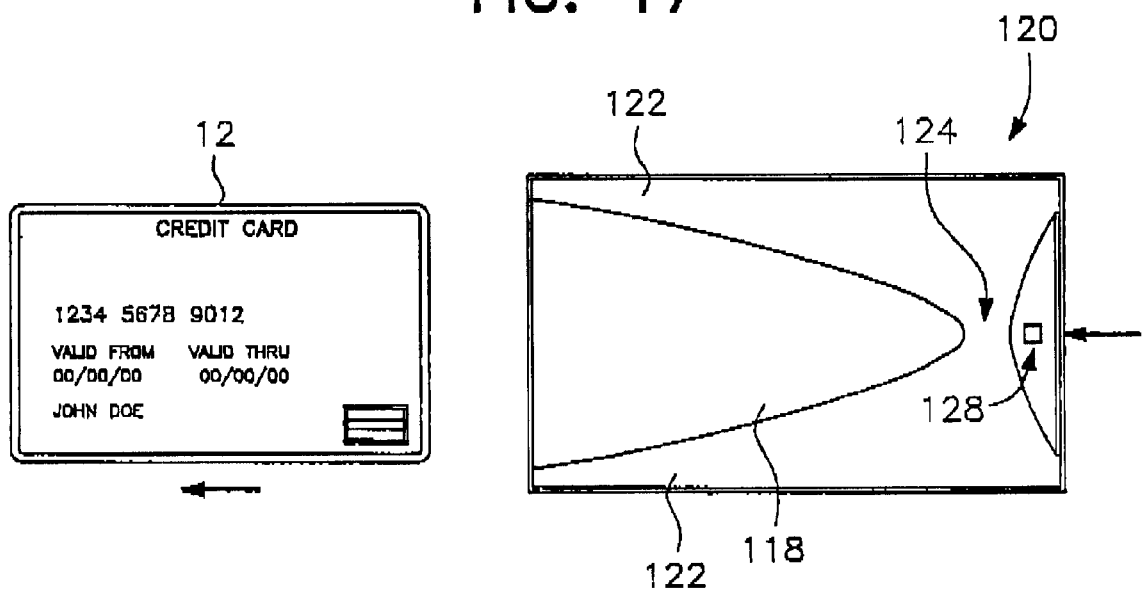
FIG. 17 is a top view of a thin profile credit card reader with card in accordance with an embodiment of the present invention.
Figure 18:
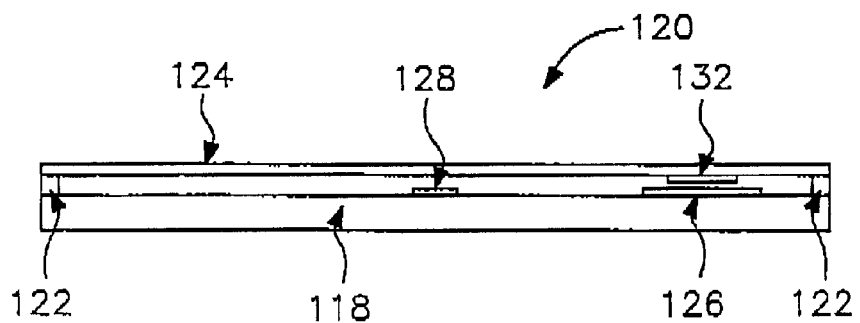
FIG. 18 is an end view of the card reader of FIG. 17.

This embodiment of the present invention is comprised of magnetoresistive sensors and associated electronic circuits, with a guiding structure for bringing the magnetic data stripe of the credit card into close proximity with the magnetoresistive sensors. The flat format of the sensor is well suited for card reading. It can be attached to the back of a cell phone or a hand held computing device. The added volume and mass of the device is very small. A representative embodiment is shown in FIGS. 17 and 18.

The card reader, generally referred to by the reference numeral 120, is composed of a substrate and electronic package 118 and has guiding rails 122 to guide the edges of the card 12. The guide rails 122 are connected by a bridge 124 to keep the card from slipping out of the rail guides. The bridge also keeps the card close to the sensor 126 as it is moved through the reader 120, in the direction of the arrow, past the sensor. A small leaf spring 132 may be provided to press on the front of the card to force the magnetic stripe on the back of the card into close proximity with the sensors. A switch 128 is provided so that power is supplied to the sensor 126 and differential amplifier 130 (see FIG. 20) when the card is inserted into the reader and the power to these circuits is shut off when the card is removed from the reader. The bridge between the rails is less than the length of the credit card (85 mm) so that the credit card can be pushed or pulled through the card reader 120.

Figure 19:
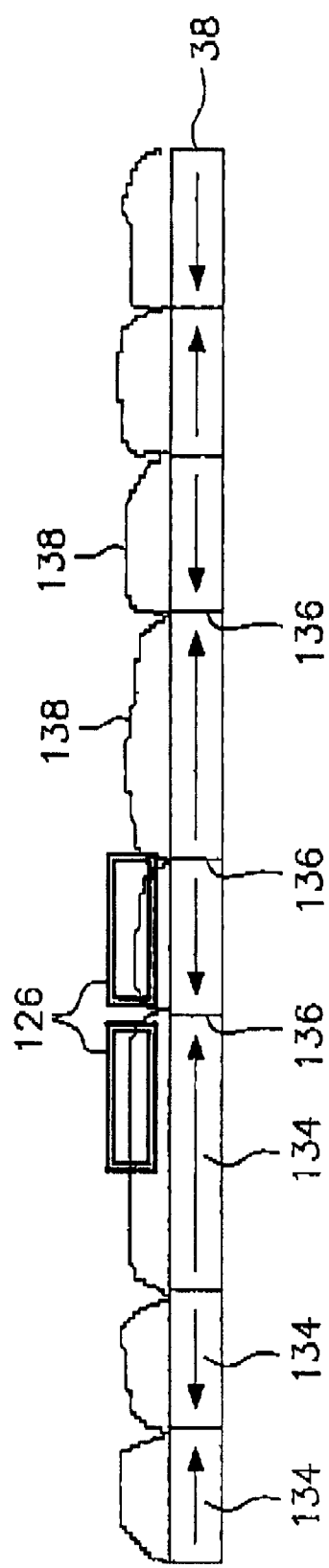
FIG. 19 is a cross-sectional view of the magnetic stripe of a credit card to be read using the card reader of FIG. 17.

Data is stored on the magnetic stripe 38 of the credit card 12 as alternately magnetized regions or domains 134 as shown in cross section in FIG. 19. Regions where the domains meet are called transitions 136 and the spacing between the transitions is used to represent binary one and zero. By international standard, transitions separated by 63.5 microns (0.0025 inches) represent binary one and transitions separated by 127 microns (0.005 inches) are binary zero. As shown in FIG. 19, the magnetic field 138 of each domain closes above the surface of the magnetic stripe. The field has a strong vertical component (perpendicular to the plane of the magnetic stripe) at the transition and a strong horizontal component (parallel to the plane of the magnetic stripe) between the transitions. Prior art magnetic card readers detect the vertical component of field to locate the transitions. The present invention uses the horizontal component of field. In the prior art inductive card readers, the core of the magnetic head is oriented perpendicular to the surface of the card to guide and detect the vertical field component. In the thin profile card reader, the magnetoresistive (MR) sensing element 126 guides and detects the horizontal field component. The horizontal field component is uniform in strength over most of the distance between transitions so the sensing element 126 can be comparable in width to the spacing between transitions and still effectively utilize the field to generate a detectable signal. Hall sensors also provide a thin profile but they only sense the vertical component of field and thus are only effective in the vicinity of the transitions.

In small magnetic fields the resistance change per unit of field is very small. For this reason, most MR sensors used in the magnetic recording industry are biased so that they operate in the most sensitive part of the resistance versus magnetic field curve. This invention also uses biasing to obtain greater sensitivity to small changes in magnetic field.

Figure 20:
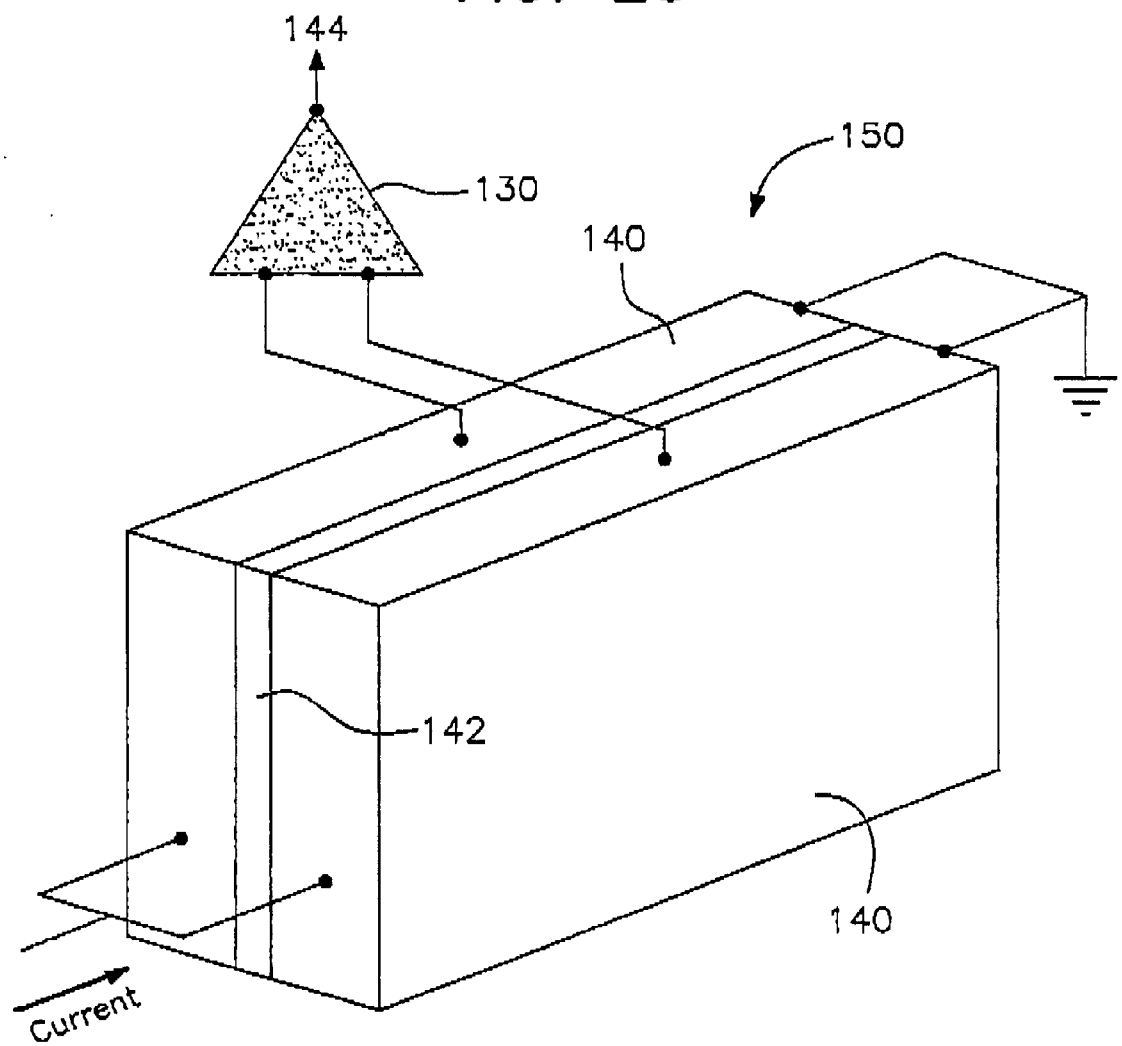
FIG. 20 is a diagram of a dual-stripe magnetoresistive sensor suitable for use in the card reader of FIG. 17.

In a preferred embodiment, the MR sensors are of the dual-stripe type, as is known in the art. As shown in FIG. 20, bias field in such a dual-stripe sensor, generally designated by the reference numeral 150, is produced by the DC current flowing through the two Permalloy sensor stripes 140 separated by an insulator 142. The current is adjusted so that the sensor stripes 140 are biased into the highest sensitivity range. The signal 144 from the dual-stripe sensor 150 is the voltage difference between the two Permalloy stripes 140, amplified by differential amplifier 130 and read with a differential detector (not shown). Differential detection provides common mode rejection of resistance changes caused by thermal noise.

Pairs of the dual-stripe sensors are used to read ones and zeros. The width of each sensing element is about equal to but slightly less than the distance separating two transitions representing a digital one. For credit cards, the ISO standard is 63.5 microns (2.5 mils) separating transitions for a one, so the sensors are 62 microns wide. The outputs of the two sensors are connected to a comparator (not shown). When the difference signal from the two sensors changes sign, either from positive to negative or from negative to positive, a transition has been detected. The magnitude of the signal is different depending on whether the transition is between a 1 and a 0 or between a 1 and a 1 or between a 0 and a 0.

Some advantages of this embodiment of the present invention over prior art card readers include the fact that, unlike the output of an inductive head, the output is independent of rate of travel. In addition, digital 1 and 0 can be distinguished by the relative magnitude of the signal rather than the time between transitions and the rate of travel. The flat format sensor is a thin film device that operates with the film in the plane parallel to the surface of the credit card so that it adds very little mass or volume to the device it is attached to. The sensor is made of high permeability alloy so it acts as a flux guide and thus produces a larger signal.

The present invention is further directed to a method of fabricating a high resolution magnetoresistive sensor, without lithography, for reading the magnetically stored digital information on a credit card.

Figure 21:
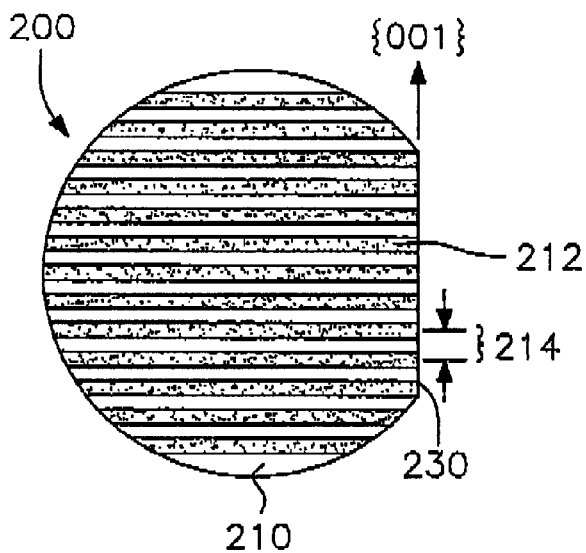
FIG. 21 depicts the rough side of a single crystal wafer of silicon to be used in fabrication of a credit card reader in accordance with the present invention.
Figure 22:
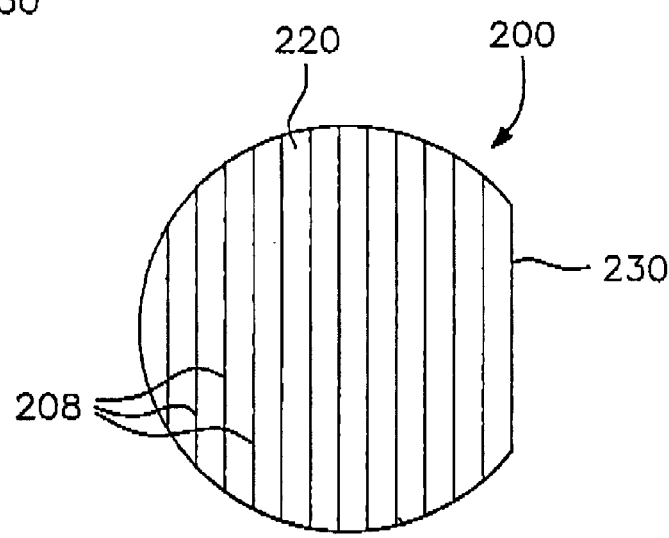
FIG. 22 depicts the polished side of the single crystal wafer of FIG. 21.

As shown in FIGS. 21 and 22, fabrication begins with a single crystal wafer of silicon with a (100) orientation, generally designated by the reference numeral 200. A typical wafer is approximately five inches, or 140 mm, in diameter and 1 mm thick. As commonly supplied, the silicon wafer has a rough, saw-cut surface 210 and a polished surface 220. A flat edge 230 is provided indicating the {001} direction which is a cleavage direction.

The saw-cut side 210 is masked with parallel strips of masking material such as adhesive-backed tape 212 that is preferably 6 mm in width. The strips of tape are preferably spaced 4 mm apart so that the center-to-center distance 214 is 10 mm. In a preferred embodiment, Kapton™ tape, a product which is commercially available and used for masking areas of a substrate from deposition, is used.

Figure 23:
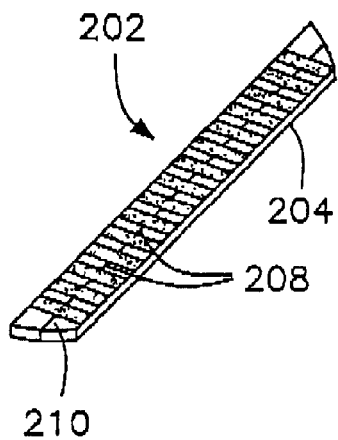
FIG. 23 illustrates a silicon bar resulting from cleaving of the wafer of FIG. 21.

As shown in FIG. 22, the polished side of the wafer is scribed with a stylus, typically diamond tipped, with the scribe lines 208 parallel to the flat edge 230 of the wafer. The scribe lines 208 are placed 10 mm apart and the wafer is cleaved at every other scribe line to produce, as shown in FIG. 23, silicon bars generally designated by the reference numeral 202. The silicon bars 202 are 20 mm in width and have straight cleaved edges 204 perpendicular to the polished surface 220 of the (100) single crystal wafer. The Kapton tape is cut at the cleavage cracks, using a sharp blade such as a scalpel, to allow separation of the 20 mm bars.

Figure 24:
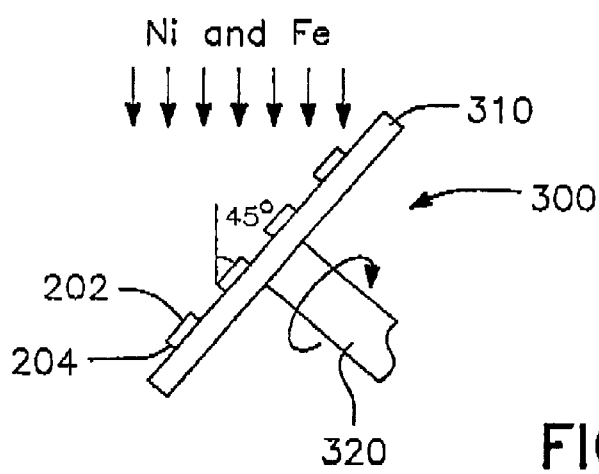
FIG. 24 shows an end view of a plurality of silicon bars being coated with permalloy, in accordance with the present invention.

As shown in FIG. 24, the silicon bars 202 are coated with permalloy so that the metallic film covers the saw-cut side 210 and the cleaved edges 204 of the silicon bar. The permalloy may be a Ni80 Fe20 alloy composition in atomic percent.

The deposition of permalloy may be performed using various methods of physical vapor deposition, as is known in the art. Ion beam deposition is well suited for this process. The silicon bars 202 are attached to a rotatable substrate holder, generally designated by the reference numeral 300, having a substrate surface 310 for holding the bars and an axis 320 for rotating the holder as shown by the arrow. The silicon bars 202 are placed with the polished side in contact with the substrate surface 310 to protect that side from flux deposition. A flux of Ni and Fe atoms is produced by ion bombardment of a target having 80 percent Ni and 20 percent Fe. The substrate holder 300 is tilted so that the flux of Ni and Fe atoms impinges on the bars at approximately a 45 degree angle to both the saw-cut surface 210 and the cleaved edge 204 of the silicon bars. The substrate holder is rotated on axis 320 so that both cleaved edges as well as the ends of each bar are coated with a continuous, electrically conducting coating of permalloy. The rotation rate of the substrate holder is preferably between one and 100 RPM.

Figure 25:
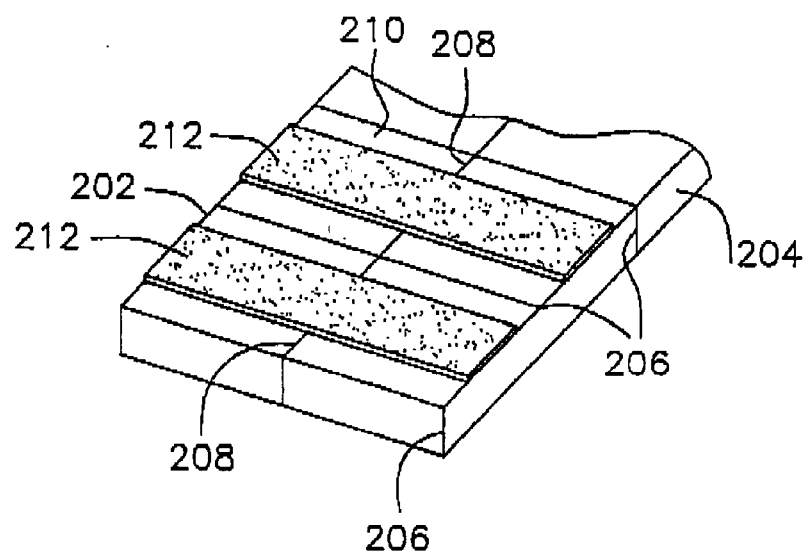
FIG. 25 illustrates the scribing and cleaving of a silicon bar of FIG. 24.

As depicted in FIG. 25, the coated bars are scribed and cleaved along new cleavage planes 206 every 10 mm, with the scribe lines perpendicular to the permalloy coated cleaved edge 204 and midway between the Kapton tape lines. This operation produces blocks of silicon 10 mm by 20 mm, each with a Kapton tape strip 212 along its length. Each block is coated with permalloy on the cleaved edges 204 (10 mm wide) and on the saw-cut surface 210 and on the Kapton tape 212.

Figure 26:
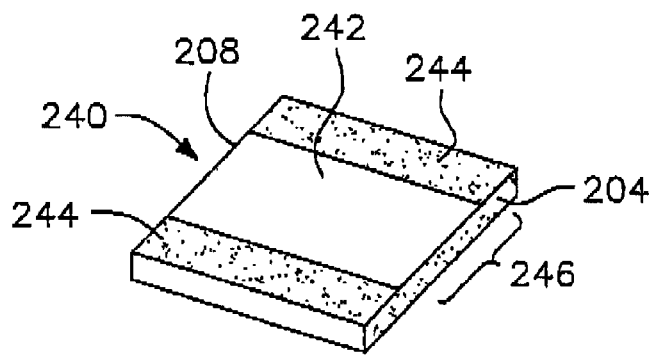
FIG. 26 illustrates a die constituting a magnetoresistive sensor which is formed by cleaving the bar of FIG. 25.

Turning to FIG. 26, the Kapton tape is removed from each block to leave an uncoated surface 242, and the block is cleaved along scribe lines 208 into two dice, with each die having sides 10 mm in length and a thickness of 1 mm. Each die is a magnetoresistive sensor, generally designated by the reference numeral 240, with the active region 246 on the cleaved edge 204 and the contact pads 244 of permalloy on the saw-cut surface. The active region is the 6 mm long portion of the edge 204 which is adjacent the uncoated surface 242 and located between the contact pads 244. In the embodiment shown, this active region 246 is approximately 1 mm high, 6 mm long and 100 nm thick. If the film of permalloy is approximately 1000 Å thick, the electrical resistance will be about 20 ohms.

Figure 27:
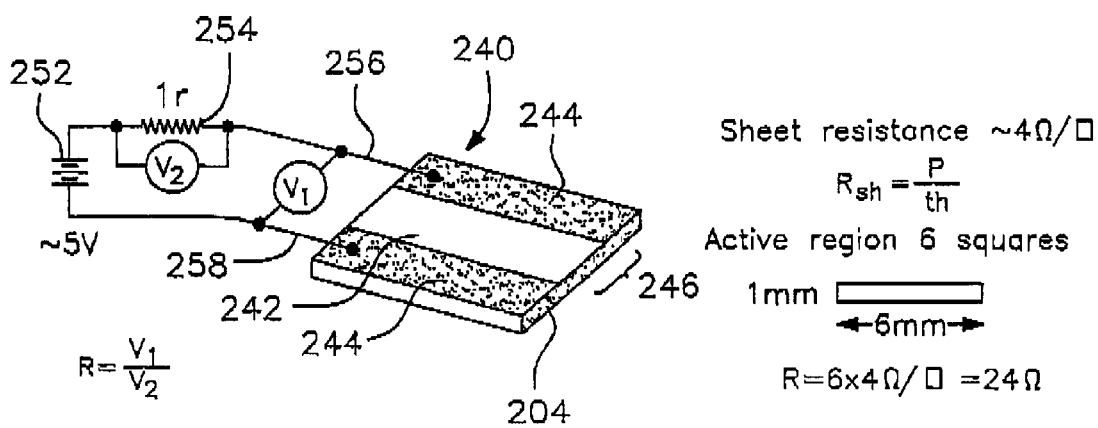
FIG. 27 shows electrical contact made to the two permalloy contact pads of the magnetoresistive sensor of FIG. 26.

Electrical contact is made to the two permalloy contact pads 244, as illustrated in FIG. 27. The device is connected to a power supply, such as a 5 volt battery 252, and a fixed resistor 254 of, for example, 1 ohm, by leads 256, 258. The voltage drop across the 1 ohm resistor is monitored as the credit card 12 is scanned past the sensor 240.

Figure 28:
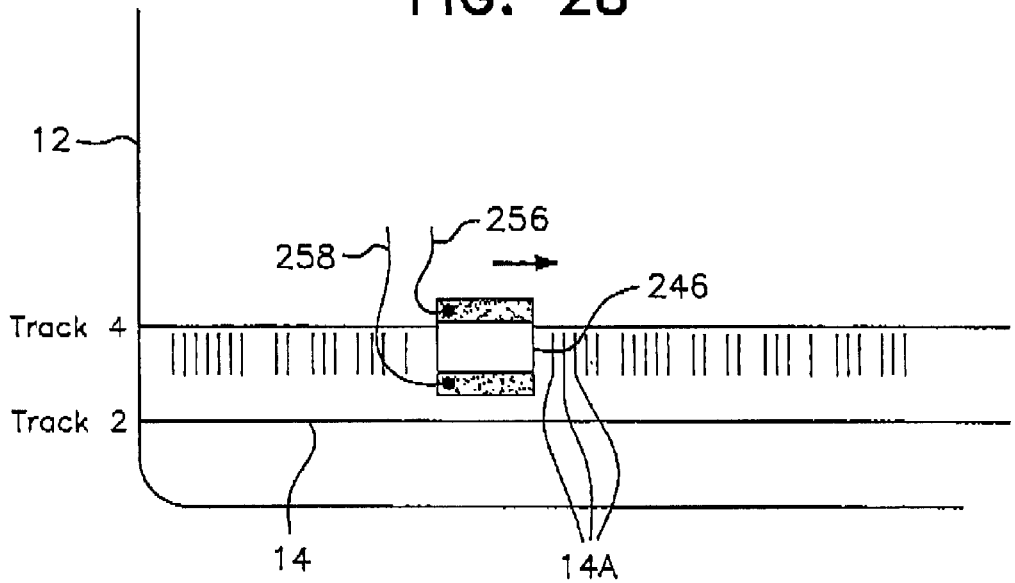
FIG. 28 depicts scanning a credit card with the magnetoresistive sensor of FIG. 27.

As shown in FIG. 28, the polished surface of the silicon is placed in contact with the credit card magnetic stripe 14, with the permalloy-coated edge 204 perpendicular to the long axis of the magnetic stripe 14. The credit card is moved with respect to the sensor 240 so the entire length of the magnetic stripe passes under the active region 246. As each magnetic transition 14A passes under the sensor, the resistance of the active region 246 will increase so the current in the circuit will decrease, causing the voltage drop over the 1 ohm resistor 254 to decrease.

Information on the card is typically stored in two tracks, each of which is approximately 6 mm wide. Because the active region is approximately 6 mm in length, each track can be read individually, without crosstalk between the tracks that might arise from a longer active region.

Figure 29:
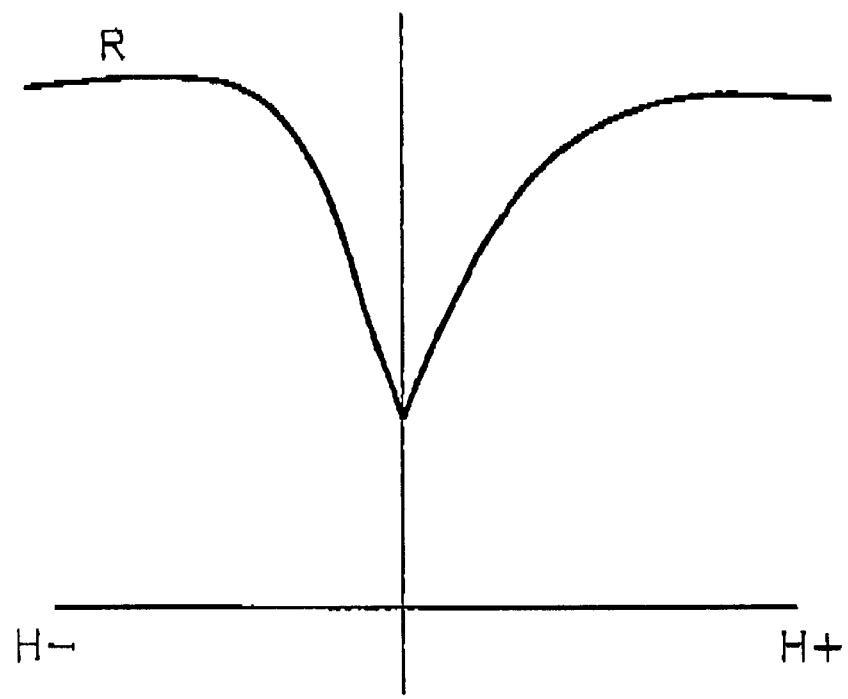
FIG. 29 is a graph illustrating a characteristic relationship between resistance and magnetic field (H) using the sensor fabricated in accordance with the present invention.

The characteristics of the sensor are graphically illustrated in FIG. 29 which shows the relationship between resistance and magnetic field (H). As shown, the slopes shown for resistance are equivalent whether the magnetic field is positive or negative. Resistance levels off in the presence of a saturating magnetic field, whether positive or negative.

Figure 30:
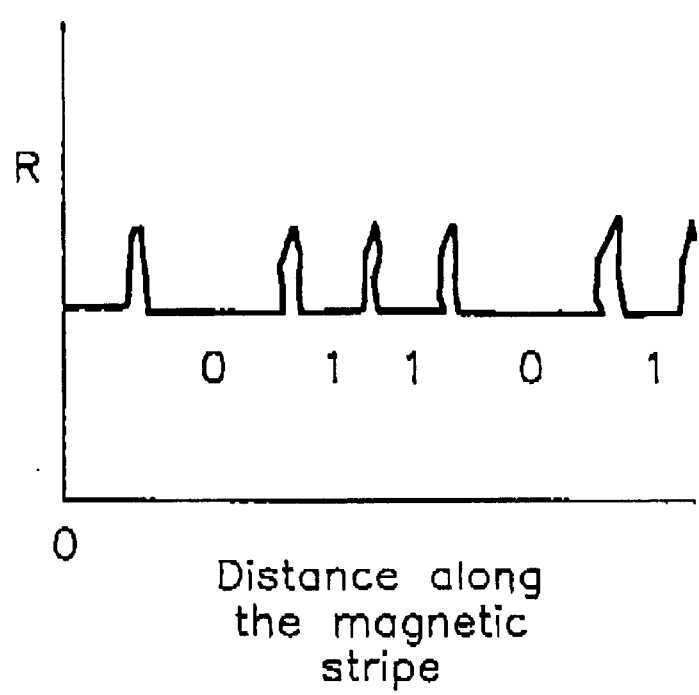
FIG. 30 is a graph illustrating the spacing between magnetic events and the relationship of magnetic transitions to resistance when scanning a card as set forth in FIG. 28.

FIG. 30 is a graph of the Z component of field, i.e., the component of the magnetic field that is perpendicular to the card surface, detected by the active region when scanning the magnetic stripe of the card. The zeros and ones indicate spacing between the resistance peaks, with a zero indicating a distance twice that of a one, as is known in the art. As shown, resistance increases in the presence of magnetic fields created by the magnetic transitions in the card.

Large voltage signals are possible from this device. If, for example, a constant current supply is used, the voltage drop over the active region can be monitored directly. With 250 mA of current, the voltage drop over the active region will be about 5 volts; the transition will change the resistance by about 2% so the signal will be about 100 mV.

The present invention offers advantages over other credit card readers such as, unlike a Hall sensor, which has four terminals, the sensor just described is a two terminal device. In addition, with the present invention the spacial resolution along the stripe is controlled by the film thickness, which is approximately 100 nm, while with the Hall device resolution is set by the lithographic resolution used to define the width of the electrical contacts to the Hall sensor material, typically 20 microns. In addition, the sensor fabricated without lithography as set forth herein has a low profile as compared to an inductive head, and has an output that is independent of the speed of motion of the card with respect to the sensor.

The foregoing descriptions and drawings should be considered as illustrative only of the principles of the invention. The invention may be configured in a variety of manners and is not limited by the dimensions or features of the preferred embodiments. Numerous applications of the present invention will readily occur to those skilled in the art. For example, the card reader may be used to generate sound signals corresponding to information read from an electronic smart card. In addition, the reader may be solar powered. Therefore, it is not desired to limit the invention to the specific examples disclosed or the exact construction and operation shown and described. Rather, all suitable modifications and equivalents may be resorted to, falling within the scope of the invention.

We claim:

1. A method for fabricating a magnetoresistive sensor from a silicon wafer having a first side and a second side, comprising the steps of:

masking the first side of the silicon wafer with a plurality of substantially parallel strips of masking material spaced from one another;

scribing the second side of the silicon wafer with a first set of substantially parallel scribe lines spaced from one another, said scribed lines being substantially perpendicular to said strips of masking material;

cleaving the wafer along every other scribe line in said first set to produce a plurality of silicon bars with cleaved edges;

coating the silicon bars with permalloy to cover the first side and the cleaved edges;

scribing the coated silicon bars with a second set of substantially parallel scribe lines;

cleaving the bars along said second set of scribe lines to produce a plurality of silicon blocks; and removing the parallel strips of masking material and cleaving each of said blocks along remaining scribe lines in said first set to produce a plurality of magnetoresistive sensors for use as credit card readers.

2. The method as set forth in claim 1, wherein said plurality of strips of masking material include strips of Kapton tape spaced equidistantly from one another.

3. The method as set forth in claim 2, wherein each strip of Kapton tape is approximately 6 mm wide.

4. The method as set forth in claim 3, wherein a distance from a lateral center of one strip to a lateral center of an adjacent strip is approximately 10 mm.

5. The method as set forth in claim 1, wherein said scribe lines within said first set are spaced approximately 10 mm apart such that each of said plurality of silicon bars is approximately 20 mm in width.

6. The method as set forth in claim 1, wherein the step of coating is performed using ion beam deposition.

7. The method as set forth in claim 1, wherein the step of coating comprises the step of bombarding, at an angle of approximately 45°, a rough side and the cleaved edges of said silicon bars with a flux of nickel and iron atoms.

8. The method as set forth in claim 1, wherein the step of coating comprises the steps of:

placing the silicon bars on a substrate holder with a polished side facing the substrate holder;

tilting the substrate holder at an angle of approximately 45° relative to a source of flux;

bombarding the silicon bars with a flux of nickel and iron atoms from the source;

rotating, during the step of bombarding, the substrate holder so that the rough side and the cleaved edges of said silicon bars are coated with permalloy.

9. The method as set forth in claim 1, wherein said scribe lines within said second set are spaced approximately 10 mm apart.

10. The method as set forth in claim 1, wherein the first side is rough and the second side is polished.

11. The method as set forth in claim 10, wherein the silicon wafer has a flat edge and said first set of scribe lines are substantially parallel with said flat edge.

12. The method as set forth in claim 1, further comprising the steps of:

connecting at least one of said magnetoresistive sensors to a circuit having a power supply and a fixed resistor;

scanning a credit card having a magnetic stripe past said at least one sensor;

monitoring, during the step of scanning, a voltage drop across the fixed resistor responsive to magnetic transitions in said magnetic stripe.

13. A method for fabricating a magnetoresistive sensor from a silicon wafer having a rough side and a polished side, comprising the steps of:

masking the rough side of the silicon wafer with parallel strips of tape spaced to be substantially equidistant from one another;

scribing the polished side of the silicon wafer with a first set of substantially parallel scribe lines spaced substantially equidistantly, said first set of parallel scribed lines being substantially perpendicular to said parallel strips of tape;

cleaving the wafer along every other scribe line in said first set to produce a plurality of silicon bars having straight cleaved edges perpendicular to the polished side;

coating the plurality silicon bars with a permalloy to cover the rough side and said cleaved edges;

scribing the coated silicon bars on said rough side with a second set of scribe lines substantially parallel to and spaced substantially equidistantly from edges of adjacent strips of tape;

cleaving the bars along said second set of parallel scribe lines to produce silicon blocks, each block having a strip of tape extending lengthwise substantially down a center of a top surface thereof;

removing the strip of tape from each block and cleaving each of said blocks along remaining scribe lines from said first set to produce a plurality of magnetoresistive sensors for use in scanning a credit card, each sensor having an active region along a respective coated cleaved edge.

14. The method as set forth in claim 13, wherein said plurality of strips of tape include strips of Kapton tape.

15. The method as set forth in claim 14, wherein each strip of Kapton tape is approximately 6 mm wide.

16. The method as set forth in claim 15, wherein a distance from a lateral center of one strip to a lateral center of an adjacent strip is approximately 10 mm.

17. The method as set forth in claim 13, wherein said scribe lines within said first set are spaced approximately 10 mm apart such that each of said plurality of silicon bars is approximately 20 mm in width.

18. The method as set forth in claim 13, wherein the step of coating is performed using ion beam deposition.

19. The method as set forth in claim 18, wherein the wafer is approximately 1 mm thick and said active region is approximately 6 mm long, 1 mm high and 100 nm in thickness.

20. The method as set forth in claim 13, wherein the step of coating comprises the step of bombarding, at an angle of approximately 45°, the rough side and the cleaved edges of said silicon bars with a flux of nickel and iron atoms.

21. The method as set forth in claim 13, wherein the step of coating comprises the steps of:

placing the silicon bars on a substrate holder with the polished side facing the substrate holder;

tilting the substrate holder at an angle of approximately 45° relative to a source of flux;

bombarding the silicon bars with a flux of nickel and iron atoms from the source;

rotating, during the step of bombarding, the substrate holder so that the rough side and the cleaved edges of said silicon bars are coated with permalloy.

22. The method as set forth in claim 13, wherein said scribe lines within said second set are spaced approximately 10 mm apart.

23. The method as set forth in claim 13, further comprising the steps of:

connecting at least one of said magnetoresistive sensors to a circuit having a power supply and a fixed resistor;

scanning a credit card having a magnetic stripe past said at least one sensor;

monitoring, during the step of scanning, a voltage drop across the fixed resistor responsive to magnetic transitions in said magnetic stripe.

24. The method as set forth in claim 13, wherein the silicon wafer has a flat edge and said first set of scribe lines are substantially parallel with said flat edge.

25. A method for fabricating a credit card reader from a silicon wafer having a rough side, a polished side and a flat edge, comprising the steps of:

masking the rough side of the silicon wafer with parallel strips of tape spaced to be substantially equidistant from one another;

scribing the polished side of the silicon wafer with a first set of substantially parallel scribe lines spaced substantially equidistantly, said first set of parallel scribed lines being substantially parallel with said flat edge and substantially perpendicular to said parallel strips of tape;

cleaving the wafer along every other scribe line in said first set to produce a plurality of silicon bars having straight cleaved edges perpendicular to the polished side;

coating the plurality silicon bars with a permalloy using ion beam deposition to cover the rough side and said cleaved edges;

scribing the coated silicon bars on said rough side with a second set of scribe lines substantially parallel to and spaced substantially equidistantly from edges of adjacent strips of tape;

cleaving the bars along said second set of parallel scribe lines to produce a plurality of silicon blocks, each block having a strip of tape extending lengthwise substantially down a center of a top surface thereof;

removing the strip of tape from each block and cleaving each of said blocks along remaining scribe lines from said first set to produce a plurality of magnetoresistive sensors, each sensor having an active region along a respective coated cleaved edge; and connecting at least one of said magnetoresistive sensors to a circuit having a power supply and a fixed resistor.

26. The method as set forth in claim 25, wherein each strip of tape is approximately 6 mm wide.

27. The method as set forth in claim 26, wherein a distance from a lateral center of one strip to a lateral center of an adjacent strip is approximately 10 mm.

28. The method as set forth in claim 25, wherein said scribe lines within said first set are spaced approximately 10 mm apart such that each of said plurality of silicon bars is approximately 20 mm in width.

29. The method as set forth in claim 25, wherein the step of coating comprises the step of bombarding, at an angle of approximately 45°, the rough side and the cleaved edges of said silicon bars with a flux of nickel and iron atoms.

30. The method as set forth in claim 25, wherein the step of coating comprises the steps of:

placing the silicon bars on a substrate holder with the polished side facing the substrate holder;

tilting the substrate holder at an angle of approximately 45° relative to a source of flux;

bombarding the silicon bars with a flux of nickel and iron atoms from the source;

rotating, during the step of bombarding, the substrate holder so that the rough side and the cleaved edges of said silicon bars are coated with permalloy.

31. The method as set forth in claim 25, wherein said scribe lines within said second set are spaced approximately 10 mm apart.

32. The method as set forth in claim 25, further comprising the steps of:

scanning a credit card having a magnetic stripe past said at least one sensor;

monitoring, during the step of scanning, a voltage drop across the fixed resistor responsive to magnetic transitions in said magnetic stripe.

33. The method as set forth in claim 25, wherein said plurality of strips of tape include strips of Kapton tape.

34. The method as set forth in claim 25, wherein the wafer is approximately 1 mm thick and said active region is approximately 6 mm long, 1 mm high and 100 nm in thickness.

* * * * *